(12) United States Patent
Ohshima et al.

(10) Patent No.: US 10,012,957 B2
(45) Date of Patent: Jul. 3, 2018

(54) TIME MEASUREMENT DEVICE

(71) Applicant: RIKEN, Saitama (JP)

(72) Inventors: Takashi Ohshima, Saitama (JP); Yuji Otake, Saitama (JP); Hirokazu Maesaka, Saitama (JP); Shin-ichi Matsubara, Hyogo (JP)

(73) Assignee: RIKEN, Saitama (JP)

( * ) Notice: Subject to any disclaimer, the term of this patent is extended or adjusted under 35 U.S.C. 154(b) by 0 days.

(21) Appl. No.: 15/544,773

(22) PCT Filed: Jan. 7, 2016

(86) PCT No.: PCT/JP2016/050335
§ 371 (c)(1),
(2) Date: Jul. 19, 2017

(87) PCT Pub. No.: WO2016/117367
PCT Pub. Date: Jul. 28, 2016

(65) Prior Publication Data
US 2017/0371301 A1 Dec. 28, 2017

(30) Foreign Application Priority Data
Jan. 20, 2015 (JP) .................................. 2015-008638

(51) Int. Cl.
*G04F 10/04* (2006.01)
*G04F 10/06* (2006.01)
*H03K 5/135* (2006.01)

(52) U.S. Cl.
CPC .............. *G04F 10/06* (2013.01); *G04F 10/04* (2013.01); *H03K 5/135* (2013.01)

(58) Field of Classification Search
CPC .......... G04F 10/04; G04F 10/06; H03K 5/135
See application file for complete search history.

(56) References Cited

U.S. PATENT DOCUMENTS 5,566,139 A * 10/1996 Abshire .................. G04F 10/06
368/118
5,903,522 A * 5/1999 Carley .................... G04F 10/06
331/1 A (Continued)

FOREIGN PATENT DOCUMENTS

JP H05-150056 A 6/1993

OTHER PUBLICATIONS

Written Opinion of the International Searching Authority issued in PCT/JP2016/050335 dated Apr. 12, 2016 (3 pages).

(Continued)

*Primary Examiner* — Patrick O'Neill
(74) *Attorney, Agent, or Firm* — Osha Liang LLP

(57) ABSTRACT

A time measurement device measures a time interval between input timings of first and second pulsed target signals. The device includes: a processor; a number-of-periods detector that detects, by using a clock signal with a predetermined clock frequency and a predetermined clock period, the time interval in units of the clock period; and a phase detection unit including a band-pass filter. The band-pass filter receives at least one of the first and second target signals as a filtering target signal and extracts a signal component of the clock frequency from the filtering target signal. The phase detection unit detects a phase difference between the extracted signal and the clock signal. The processor derives, by using a result detected by the number-of-periods detector and the detected phase difference, the time interval at a resolution finer than the clock period.

9 Claims, 18 Drawing Sheets

(56) References Cited

U.S. PATENT DOCUMENTS 5,982,712 A * 11/1999 Smith .................. G04F 10/04
368/120
6,246,737 B1 * 6/2001 Kuglin .................. G04F 10/04
331/45

OTHER PUBLICATIONS

International Search Report issued in PCT/JP2016/050335 dated Apr. 12, 2016, with translation (3 pages).

* cited by examiner

TIME MEASUREMENT DEVICE

TECHNICAL FIELD

The present invention relates to time measurement devices.

BACKGROUND ART

The measurement of the time interval between a start trigger signal and a stop trigger signal is achieved by counting, with a counter, how many times zero-crossing occurs in a reference clock between the timing of an up edge of the start trigger signal (the timing that it rises) and the timing of an up edge of the stop trigger signal. This method, however, provides a resolution no finer than an integer times the period of the reference clock. To obtain a measurement resolution finer than the clock period, various methods have been proposed.

FIG. 20 is an outline configuration diagram of a conventional time measurement device that provides a measurement resolution finer than the clock period, and FIG. 21 is a diagram illustrating the operation of the time measurement device in FIG. 20 (see, for example, Patent Document 1 identified below). In the time measurement device in FIG. 20, a capacitor C is charged to a predetermined voltage in advance. At the timing that a trigger pulse is received, a switch SW is turned on so that the capacitor C is connected to a constant-current circuit to start discharging the electric charge stored in the capacitor C. The discharging is stopped by the switch SW being turned off at the timing that, after the trigger pulse, the reference clock is received (at an up edge timing of the reference clock). The change $\Delta V$ in the voltage across the capacitor C resulting from the discharging is read by an AD converter. The amount of integral electric charge that is discharged by the constant-current circuit is proportional to the discharge time, and thus the voltage $\Delta V$ has a value commensurate with the time difference $\Delta T$ between the trigger pulse and the reference clock. Thus, the voltage $\Delta V$ provides information on a time interval shorter than the clock period.

LIST OF CITATIONS

Patent Literature

Patent Document 1: Japanese Patent Application published as No. H5-150056

In the configuration in FIG. 20, the period of the reference clock is set at about 10 nanoseconds (that is, the clock frequency is set at about 100 MHz), and the practical accuracy (resolution) of time interval measurement is no finer than about 25 picoseconds. The chief reason is as follows. Turning the switch SW on or off takes time of the order of nanoseconds, resulting in an accordingly coarser resolution. Not unrelated to this, on account of the characteristics of the circuit including the switch SW, immediately after the start and immediately before the end of the discharging of the capacitor C (parts enclosed in broken-line ellipses 2011 and 2012 in FIG. 21), it is difficult to obtain linearity in the fall of the voltage across the capacitor C, making it impossible to obtain ideal voltage information $\Delta V$. For this reason, with the configuration in FIG. 20, even if the clock frequency is set higher than 100 MHz, the response of the switch SW and the non-linearity in the fall of the capacitor voltage eventually act as a bottleneck, making it difficult to improve the practical accuracy (resolution) of time interval measurement.

For example, in an X-ray free electron laser accelerator, the timing of a beam chopper that operates pulsewise is required to be stabilized with an accuracy of one picosecond or less, and with the configuration in FIG. 20, it is difficult to meet the requirement.

SUMMARY OF THE INVENTION

One or more embodiments of the present invention provide a time measurement device that contributes to higher accuracy in measurement of the time interval between two signals.

A time measurement device according to one or more embodiments of the present invention is a time measurement device for measuring the time interval between the input timings of a first and a second target signal each being a pulsed signal, and it includes: a number-of-periods detector which, by using a clock signal with a predetermined clock frequency and a predetermined clock period, detects the time interval in units of the clock period; a phase detection unit including a band-pass filter, wherein the band-pass filter receives at least one of the first and second target signals as a filtering target signal and extracts a signal component of the clock frequency from the filtering target signal, and the phase detection unit detects the phase difference between the extracted signal and the clock signal; and a processor which, by using the result detected by the number-of-periods detector and the phase difference detected by the phase detection unit, derives the time interval at a resolution finer than the clock period.

According to one or more embodiments, the filtering target signal, which is a pulsed signal, contains signal components of different frequencies including the clock frequency, and thus, by use of a band-pass filter, the signal component of the clock frequency can be extracted from the filtering target signal. The phase difference between the extracted signal and the clock signal represents a time component shorter than the clock period within the time interval, and thus, by use of the result detected by the number-of-periods detector and the phase difference detected by the phase detection unit, the time interval can be calculated at a resolution finer than the clock period. In measuring the time component shorter than the clock period within the time interval, there is no need to rely on a component such as a switch SW (FIG. 20), and thus the time interval can be measured with high accuracy.

According to one or more embodiments of the present invention, it is possible to provide a time measurement device that contributes to higher accuracy in measurement of the time interval between two signals.

DETAILED DESCRIPTION OF EMBODIMENTS

Figure 1:
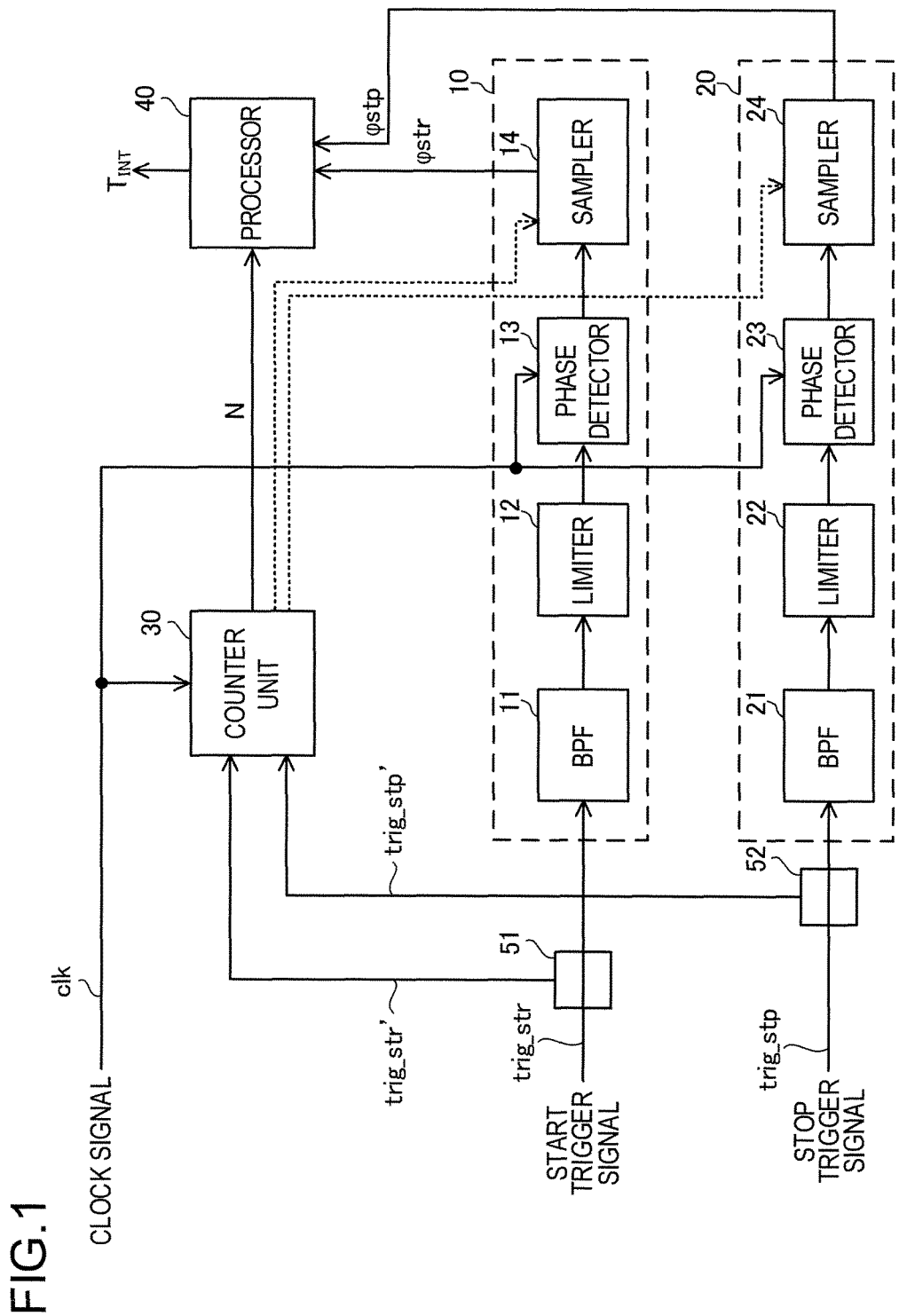
FIG. 1 is a block diagram of a time measurement device according to a first embodiment of the present invention.

Hereinafter, examples embodying the present invention will be described specifically with reference to the accompanying drawings. Among the diagrams referred to, the same parts are identified by the same reference numerals, and in principle no overlapping description of the same parts will be repeated. In the present description, for the sake of simple description, symbols and other designations referring to information, signals, physical quantities, components, and the like are occasionally used with the names of the corresponding information, signals, physical quantities, components, and the like omitted or abbreviated.

<<First Embodiment>>

A first embodiment of the present invention will be described below. FIG. 1 is a block diagram of a time measurement device (time interval measurement device) according to a first embodiment. The time measurement device in FIG. 1 includes blocks identified by the reference signs 10, 20, 30, 40, 51, and 52.

An arbitrary square-wave signal (including a digital signal such as a clock signal) handled by the time measurement device is a voltage signal, and selectively takes one of two signal levels: either a low level or a higher level higher than the low level. In a square-wave signal (including a digital signal such as a clock signal), the transition of the signal level from low level to high level is referred to as an up edge, and the timing of the transition is referred to as an up edge timing.

The time measurement device receives a start trigger signal trig_str and a stop trigger signal trig_stp, and also receives a clock signal clk having a predetermined clock frequency and a predetermined clock period $T_{RF}$. The start and stop trigger signals trig_str and trig_stp are each a pulsed square-wave signal. A clock generator (unillustrated) which generates the clock signal clk may be incorporated in the time measurement device. The stop trigger signal trig_stp is fed to the time measurement device later than the start trigger signal trig_str. In this embodiment, the clock frequency of the clock signal clk is assumed to be 5.7 GHz (gigahertz). Accordingly, the clock period $T_{RF}$ is about 175 picoseconds.

The start trigger signal trig_str is fed to a start-side phase detection unit 10 via a signal splitter 51, and the stop trigger signal trig_stp is fed to a stop-side phase detector unit 20 via a signal splitter 52. The signal splitter 51 supplies a signal obtained by reducing the signal intensity of the start trigger signal trig_str, that is, an intensity-reduced start trigger signal trig_str', to a counter unit 30. The signal splitter 52 supplies a signal obtained by reducing the signal intensity of the stop trigger signal trig_stp, that is, an intensity-reduced stop trigger signal trig_stp', to the counter unit 30. The signal splitters 51 and 52 are used to split signals. In a case where the output signal intensity of a band-pass filter, which will be described later, is low, it is possible, by increasing the signal intensity of the input signals (trig_str and trig_stp), to improve the signal-to-noise ratio. In that case, the signal splitters 51 and 52 can be provided with an attenuator for logic signals. Or the signal intensity of the start and stop trigger signals may be reduced within the counter unit 30 (in that case, the signal intensity reducing function of the signal splitters 51 and 52 may be omitted).

The start-side phase detection unit 10 detects and outputs the phase φstr of the start trigger signal trig_str with respect to the clock signal clk (in other words, the phase φstr of the clock signal clk at the timing that the start trigger signal trig_str is fed to the time measurement device). The stop-side phase detection unit 20 detects and outputs the phase φstp of the stop trigger signal trig_stp with respect to the clock signal clk (in other words, the phase φstp of the clock signal clk at the timing that the stop trigger signal trig_stp is fed to the time measurement device). In this embodiment, the phases φstr and φstp are given in the unit of degrees. That is, the phases φstr and φstp each take a value in the range from 0° to 360°. Also the phase of any clock signal including the clock signal clk takes a value in the range from 0° to 360°. It is assumed that, with respect to a given clock signal, the phase of the clock signal at its up edge timing is 0°.

Figure 2:
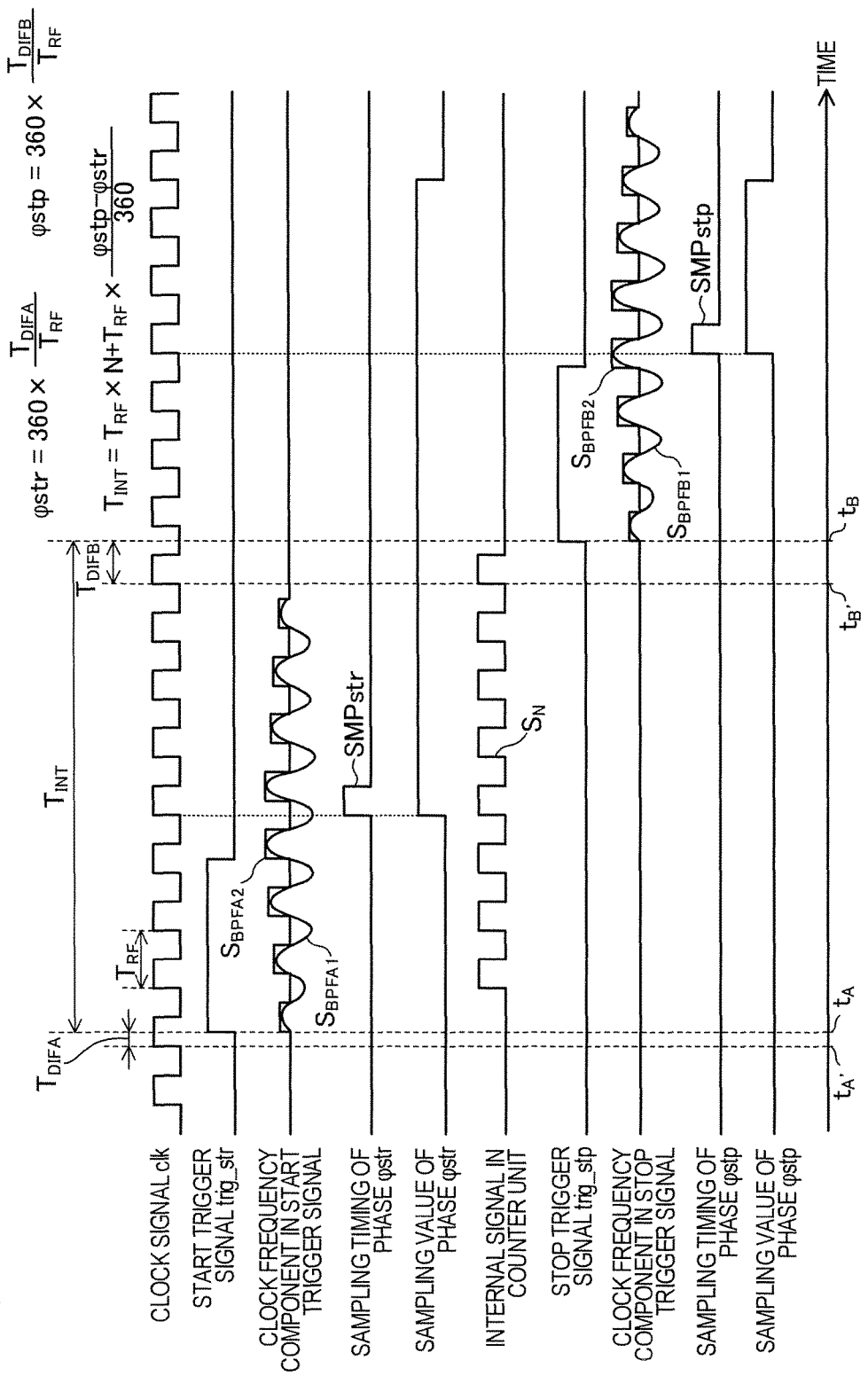
FIG. 2 is a diagram showing, in connection with the first embodiment of the present invention, the waveforms of signals at relevant spots in the time measurement device.

FIG. 2 shows signal waveforms at relevant spots in the time measurement device. Let $T_{DIFA}$ represent the time difference between the up edge timing $t_A$ of the signal trig_str and the immediately preceding up edge timing $t_A'$ of the clock signal clk relative to the up edge timing $t_A$ of the signal trig_str. Then, the phase φstr equals the time difference $T_{DIFA}$ multiplied by $360/T_{RF}$, and is given by φstp=$360 \times T_{DIFA}/T_{RF}$. When the up edge timing $t_A$ of the signal trig_str coincides completely with an up edge timing of the clock signal clk, the phase φstr equals 0°. In this embodiment, it is assumed that the pulse width of the start trigger signal trig_str (the period for which the signal trig_str remains at high level) equals three times the clock period $T_{RF}$ (the same applies to the stop trigger signal).

Let $T_{DIFB}$ represent the time difference between the up edge timing $t_B$ of the signal trig_stp and the immediately preceding up edge timing $t_B'$ of the clock signal clk relative to the up edge timing $t_B$ of the signal trig_stp. Then, the phase φstp equals the time difference $T_{DIFB}$ multiplied by $360/T_{RF}$, and is given by φstp=$360 \times T_{DIFB}/T_{RF}$. When the up edge timing $t_B$ of the signal trig_stp coincides completely with an up edge timing of the clock signal clk, the phase φstp equals 0°.

The time measurement device can derive the time interval $T_{INT}$ between the input timings of the start and stop trigger signals trig_str and trig_stp to the time measurement device. The input timings of the start and stop trigger signals trig_str and trig_stp to the time measurement device are the timings $t_A$ and $t_B$ respectively. That is, the time interval $T_{INT}$ represents the time difference between the timings $t_A$ and $t_B$.

By using the signals trig_str' and trig_stp' and the clock signal clk, the counter unit 30 counts the number of clocks N in the clock signal clk between the input timings of the start and stop trigger signals. More specifically, the counter unit 30 counts how many up edges there are in the clock signal clk after the timing $t_A$ and before the timing $t_B$, and detects the count value as the number of clocks N. That is, the counter unit 30 detects the time interval $T_{INT}$ in units of the clock period $T_{RF}$ (as a minimum unit), and the time interval $T_{INT}$ detected by the counter unit 30 equals ($T_{RF} \times$ N). In the example in FIG. 2, "N=8". The signal $S_N$ in FIG. 2 is an internal signal of the counter unit 30, and the number of clocks in the signal $S_N$ determines the value N.

By using a frequency as high as 5.7 GHz as the frequency of the clock signal used in the counter unit 30, it is possible to enhance the time resolution in the counter unit 30. In a conventional configuration corresponding to FIG. 20, a clock signal of about 100 MHz (megahertz) is used; that is, a low frequency about 1/57 as high as the clock frequency used in the embodiment is used, resulting in rather a low time resolution. In this embodiment, the counter unit 30 is implemented, for example, with a circuit composed of cascade-connected flip-flops that can operate at high frequencies.

To achieve a time resolution finer than the clock period, the phase detection units 10 and 20 use BPFs (band-pass filters) 11 and 21 to extract signal components of the clock frequency (5.7 GHz) from the start and stop trigger signals trig_str and trig_stp and detect the phase differences between the respective extracted signals and the clock signal. The configuration and operation of the units 10 and 20 will now be described in detail.

The start-side phase detection unit 10 includes a BPF (band-pass filter) 11, a limiter 12, a phase detector 13, and a sampler 14. The stop-side phase detection unit 20 includes a BPF (band-pass filter) 21, a limiter 22, a phase detector 23, and a sampler 24. The units 10 and 20 differ only in the signals they receive, and otherwise have the same configuration.

The BPF 11 is a band-pass filter that extracts and outputs a signal component in a predetermined pass band that is contained in the start trigger signal trig_str. and the BPF 21 is a band-pass filter that extracts and outputs a signal component in a predetermined pass band that is contained in the stop trigger signal trig_stp. The pass bands are the same between the BPFs 11 and 21, and include the clock frequency of the clock signal clk. The BPFs 11 and 21 are designed to have as narrow a pass band as possible while including the clock frequency. For example, The BPFs 11 and 21 can be implemented with cavity BPFs. In the following description, for the sake of concreteness and convenience, unless otherwise stated, it is assumed that the output signals of the BPFs 11 and 21 include only a signal component of the clock frequency (that is, a frequency component of the clock signal).

In FIG. 2, the signal $S_{BPFA1}$ is the output signal (extracted signal) of the BPF 11. That is, the signal $S_{BPFA1}$ is the signal of the clock frequency component extracted from the start trigger signal trig_str by the BPF 11. The signal $S_{BPFB1}$ is the output signal (extracted signal) of the BPF 21. That is, the signal $S_{BPFB1}$ is the signal of the clock frequency component extracted from the stop trigger signal trig_stp by the BPF 21. The signals $S_{BPFA1}$ and $S_{BPFB1}$ are each a sine-wave signal of which the amplitude varies with the passage of time, and the frequency of the sine-wave signal coincides with the clock frequency.

Being pulse signals, the start and stop trigger signals trig_str and trig_stp contain various frequency components. Thus, extracting the frequency components of the clock signal from the start and stop trigger signals trig_str and trig_stp by use of the BPFs 11 and 21 yields the sine-wave signals $S_{BPFA1}$ and $S_{BPFB1}$ having the clock frequency. In FIG. 2, starting at the up edge timing of the start trigger signal trig_str, the amplitude of the sine-wave signal $S_{BPFA1}$ first increases gradually and then decreases gradually. The details of how the amplitude of the sine-wave signal $S_{BPFA1}$ varies starting at the up edge timing of the start trigger signal trig_str depends on the filtering characteristics of the BPF 11. The same applies to the sine-wave signal $S_{BPFB1}$.

The signal levels of the sine-wave signals $S_{BPFA1}$ and $S_{BPFB1}$ each oscillate between positive and negative values about zero. At the timing $t_A$, the phase of the signal $S_{BPFA1}$ as a sine wave is 0°, and at the timing $t_B$, the phase of the signal $S_{BPFB1}$ as a sine wave is 0°. In FIG. 2, the signal $S_{BPFA2}$ is a square-wave signal that is at high level when the signal level of the sine-wave signal $S_{BPFA1}$ is zero or positive and is at low level when the signal level of the sine-wave signal $S_{BPFA1}$ is negative; the signal $S_{BPFB2}$ is a square-wave signal that is at high level when the signal level of the sine-wave signal $S_{BPFB1}$ is zero or positive and is at low level when the signal level of the sine-wave signal $S_{BPFB1}$ is negative. In the unit 10, the square-wave signal $S_{BPFA2}$ can be generated from the sine-wave signal $S_{BPFA1}$ by use of a comparator (unillustrated), and in the unit 20, the square-wave signal $S_{BPFB2}$ can be generated from the sine-wave signal $S_{BPFB1}$ by use of a comparator (unillustrated). In FIG. 2, as the amplitude of the sine-wave signal $S_{BPFA1}$ increases or decreases, the amplitude of the square-wave signal $S_{BPFA2}$ increases or decreases; in reality, however, the amplitude of the actual square-wave signal $S_{BPFA2}$ can be constant (the same applies to the square-wave signal $S_{BPFB2}$).

The limiter 12 performs a limiting operation to keep constant the amplitude of the output signal of the BPF 11 (limit the amplitude of the output signal of the BPF 11 so that it is equal to or less than a predetermined value), and the limiter 22 performs a limiting operation to keep constant the amplitude of the output signal of the BPF 21 (limit the amplitude of the output signal of the BPF 21 so that it is equal to or less than a predetermined value). The limiting operation in the limiter 12 may include a function of amplifying the output signal of the BPF 11, and the limiting operation in the limiter 22 may include a function of amplifying the output signal of the BPF 21. The output signal of the BPF 11 having undergone the limiting operation by the limiter 12 is supplied as a first comparison signal to the phase detector 13. The output signal of the BPF 21 having undergone the limiting operation by the limiter 22 is supplied as a first comparison signal to the phase detector 23. The phase detection results from the phase detectors (13, 23) can depend on the electric power of the comparison signals; the limiting operation eliminates the influence of the power-dependence of the phase detectors.

The phase detectors 13 and 23 are each supplied with the clock signal clk as a second comparison signal (reference signal). Since the first comparison signals fed to the phase detectors 13 and 23 respectively have the same frequency as the clock signal clk as the second comparison signal, it is possible to define a phase difference between the first and second comparison signals.

The phase detectors 13 and 23 each compare together the phases of the first and second comparison signals to detect the phase difference between them, and outputs a voltage signal having a voltage value commensurate with the detected phase difference (the same applies to any other phase detector mentioned later). The detected phase difference between the first and second comparison signals is the phase of the first comparison signal relative to the phase of the second comparison signal (in other words, the phase of the first comparison signal with respect to the second comparison signal). The phase difference detected by the phase detector 13 corresponds to the phase φstr, and the phase difference detected by the phase detector 23 corresponds to the phase φstp.

The first comparison signal in the phase detector 13 or 23 may be the square-wave signal $S_{BPFA2}$ or $S_{BPFB2}$ respectively. In that case, the square-wave signal $S_{BPFA2}$ or $S_{BPFB2}$ can be generated from the sine-wave signal $S_{BPFA1}$ or $S_{BPFB1}$ within the phase detector 13 or 23 or in a circuit in the stage preceding it (for example, the limiter 12 or 13). In that case, the phase detector 13 or 23 can be called a digital phase detector. Using a digital phase detector helps aim at high linearity, suppressed variations among products, and improved temperature characteristics in the phase to be detected.

When comparing together the phases of the square-wave signal $S_{BPFA2}$ and the clock signal clk, the phase detector 13 may first multiply those signals by (mix it with) a local signal having a predetermined local frequency (for example, 4.7 GHz) to reduce the frequency of the square-wave signal $S_{BPFA2}$ and the clock signal clk down to a frequency in an intermediate frequency band (for example, a frequency of 1 GHz) and then compare the two signals together. The same applies to the phase detector 23.

The phase detector 13 can use the sine-wave signal $S_{BPFA1}$ itself as the first comparison signal when comparing together the phases of the first and second comparison signals. In that case, the phase detector 13 can multiply together the sine-wave signal $S_{BPFA1}$ and the clock signal clk with an analog multiplier and detect the phase difference as the phase φstr from the result of the multiplication. The same applies to the phase detector 23, and to phase detectors that will be mentioned in the description of a second embodiment.

The sampler 14 samples the output voltage signal of the phase detector 13 to read the value of the phase φstr, and outputs the read value (sampling value) of the phase φstr to a processor 40. The sampler 24 samples the output voltage signal of the phase detector 23 to read the value of the phase φstp, and outputs the read value (sampling value) of the phase φstp to the processor 40.

The sampling timings in the samplers 14 and 24 are specified by the counter unit 30. Specifically, based on the start trigger signal trig_str' and the clock signal clk fed to it, the counter unit 30 outputs a sampling instruction signal SMPstr (see FIG. 2) to the sampler 14 at the timing that a predetermined delay time (for example, $3 \times T_{RF}$) has elapsed after the up edge timing of the clock signal clk immediately after the up edge timing $t_A$ of the start trigger signal. Likewise, based on the stop trigger signal trig_stp' and the clock signal clk fed to it, the counter unit 30 outputs a sampling instruction signal SMPstp (see FIG. 2) to the sampler 24 at the timing that a predetermined delay time (for example, $3 \times T_{RF}$) has elapsed after the up edge timing of the clock signal clk immediately after the up edge timing $t_B$ of the stop trigger signal. At the timing that the sampler 14 receives the sampling instruction signal SMPstr, it samples the output voltage signal of the phase detector 13; at the timing that the sampler 24 receives the sampling instruction signal SMPstp, it samples the output voltage signal of the phase detector 23.

The output signal of the BPF 11 immediately after the up edge timing of the start trigger signal often varies each time the start trigger signal is fed in. Specifically, for example, the "output signal of the BPF 11 immediately after the up edge timing of the start trigger signal when one start trigger signal is fed to the BPF 11" can greatly differ from the "output signal of the BPF 11 immediately after the up edge timing of the start trigger signal when another start trigger signal is fed to the BPF 11". The same applies to the BPF 21. With this taken into consideration, sampling is performed after the lapse of the above-mentioned delay time after the up edge timing of the start or stop trigger signal. However, too long a delay time causes excessive attenuation of the signal component of the clock frequency in the output signal of the BPF (11, 21), and therefore preferably the delay time is set appropriately with consideration given to the filtering characteristics of the BPF (11, 21).

The processor 40 comprises a processing device such as a microprocessor, and derives the time interval $T_{INT}$ at a resolution finer than the clock period $T_{RF}$ based on the phases φstr and φstp detected by the units 10 and 20 (that is, the values of the phases φstr and φstp obtained from the samplers 14 and 24) and the number of counts N detected by the counter unit 30. Specifically, the processor 40 calculates the time interval $T_{INT}$ according to equation (1) below. In the Examiner in FIG. 2, assuming that the clock period $T_{RF}$ is 175 picoseconds, the number of clocks N is eight and the phases φstr and φstp are 90° and 270° respectively. Thus, the time interval $T_{INT}$ derived by the processor 40 is given by "$T_{INT}=175 \times 8+175 \times (270-90)/360=1487.5$"; that is, it equals 1487.5 picoseconds.

$$T_{INT}=T_{RF} \times N+T_{RF} \times (\varphi stp - \varphi str)/360 \quad (1)$$

Figure 20:
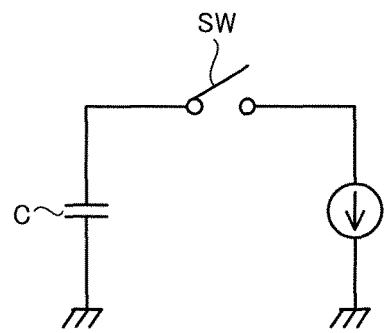
FIG. 20 is an outline configuration diagram of a conventional time measurement device.
Figure 21:
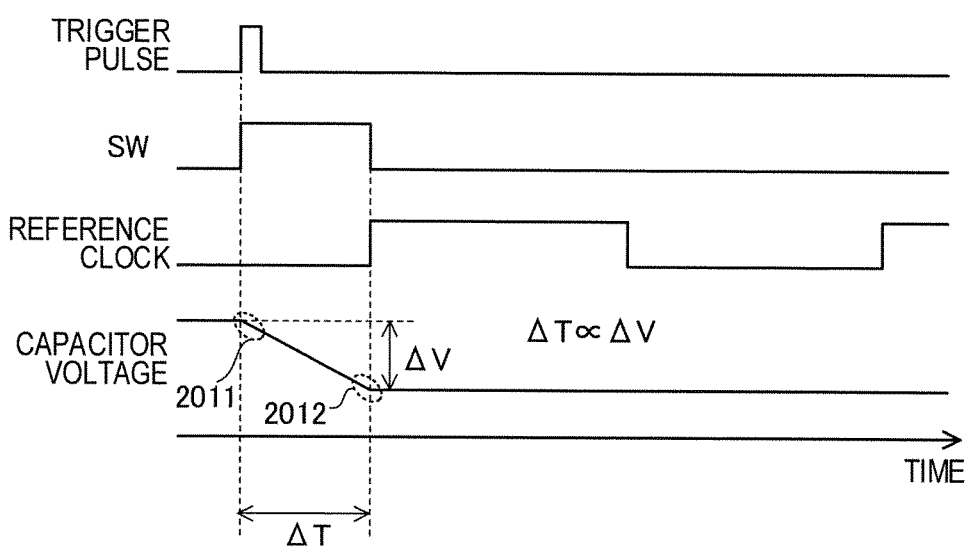
FIG. 21 is a diagram illustrating the operation of the time measurement device in FIG. 20.

According to this embodiment, it is possible to measure the time interval between trigger signals at such a high resolution as is difficult to achieve with the conventional configuration in FIG. 20.

In a case where it is previously determined that the start trigger signal is synchronous with the clock signal, that is, for example, in a case where it is previously determined that the up edge timing $t_A$ of the start trigger signal trig_str coincides with an up edge timing of the clock signal clk, the start-side phase detection unit 10 may be omitted from the time measurement device. In that case, the processor 40 can calculate the time interval $T_{INT}$ according to equation (1a). It is then assumed that the counter unit 30 does not count the up edge of the clock signal at the timing $t_A$.

$$T_{INT}=T_{RF} \times N+T_{RF} \times \varphi stp/360 \qquad (1a)$$

Likewise, in a case where it is previously determined that the stop trigger signal is synchronous with the clock signal, that is, for example, in a case where it is previously determined that the up edge timing is of the stop trigger signal trig_stp coincides with an up edge timing of the clock signal clk, the stop-side phase detection unit 20 may be omitted from the time measurement device. In that case, the processor 40 can calculate the time interval $T_{INT}$ according to equation (1b). It is then assumed that the counter unit 30 does not count the up edge of the clock signal at the timing $t_B$.

$$T_{INT}=T_{RF} \times N+T_{RF} \times (360-\varphi str)/360 \qquad (1b)$$

<<Second Embodiment>>

A second embodiment of the present invention will be described below. The second embodiment is an embodiment based on the first embodiment, and for those features of the second embodiment of which no particular mention is made, the description of the first embodiment applies to the second embodiment as well.

Figure 3:
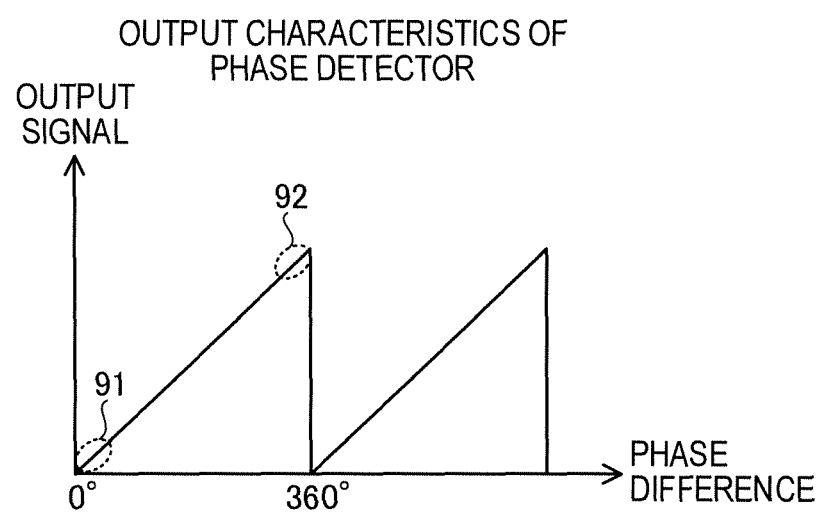
FIG. 3 is a diagram illustrating the output characteristics of a phase detector.

FIG. 3 shows the output characteristics of a phase detector like the phase detector 13 or 23. A phase detector having the output characteristics shown in FIG. 3 increases, as the phase difference between the first and second comparison signals increases from 0° to 360°, the voltage value of its output signal from a predetermined lower limit voltage value (for example, 0 volts) to a predetermined upper limit voltage value (for example, 5 volts). However, on account of the principle, the detection range of phase difference is limited from 0° to 360°, and at the limit points of the detection range, one clock worth of discontinuity arises. That is, as shown in FIG. 3, the voltage value of the output signal of the phase detector is the same when the phase difference between the first and second comparison signals is 0° and when it is 360° (because, when the phase difference changes from below 360° to just 360°, the voltage value of the output signal of the phase detector turns from close to the upper limit voltage value to the lower limit voltage value). Thus, when the phase difference between the first and second comparison signals becomes close to 0° or close to 360°, one clock worth of jitter can occur in the derived time interval $T_{INT}$.

For example, when the phase difference between the first and second comparison signals, despite actually being 0.1°, is detected being 359.9° under the influence of an detection error, the derived time interval $T_{INT}$ deviates from the true time interval $T_{INT}$ by close to one clock. Moreover, on account of the circuit design, when the phase difference between the first and second comparison signals is close to 0° or close to 360°, poor linearity is observed with respect to the phase of the output signal (output voltage) of the phase detector. In FIG. 3, the parts 91 and 92 enclosed in broken-line ellipses are the segments where poor linearity is observed.

Figure 4:
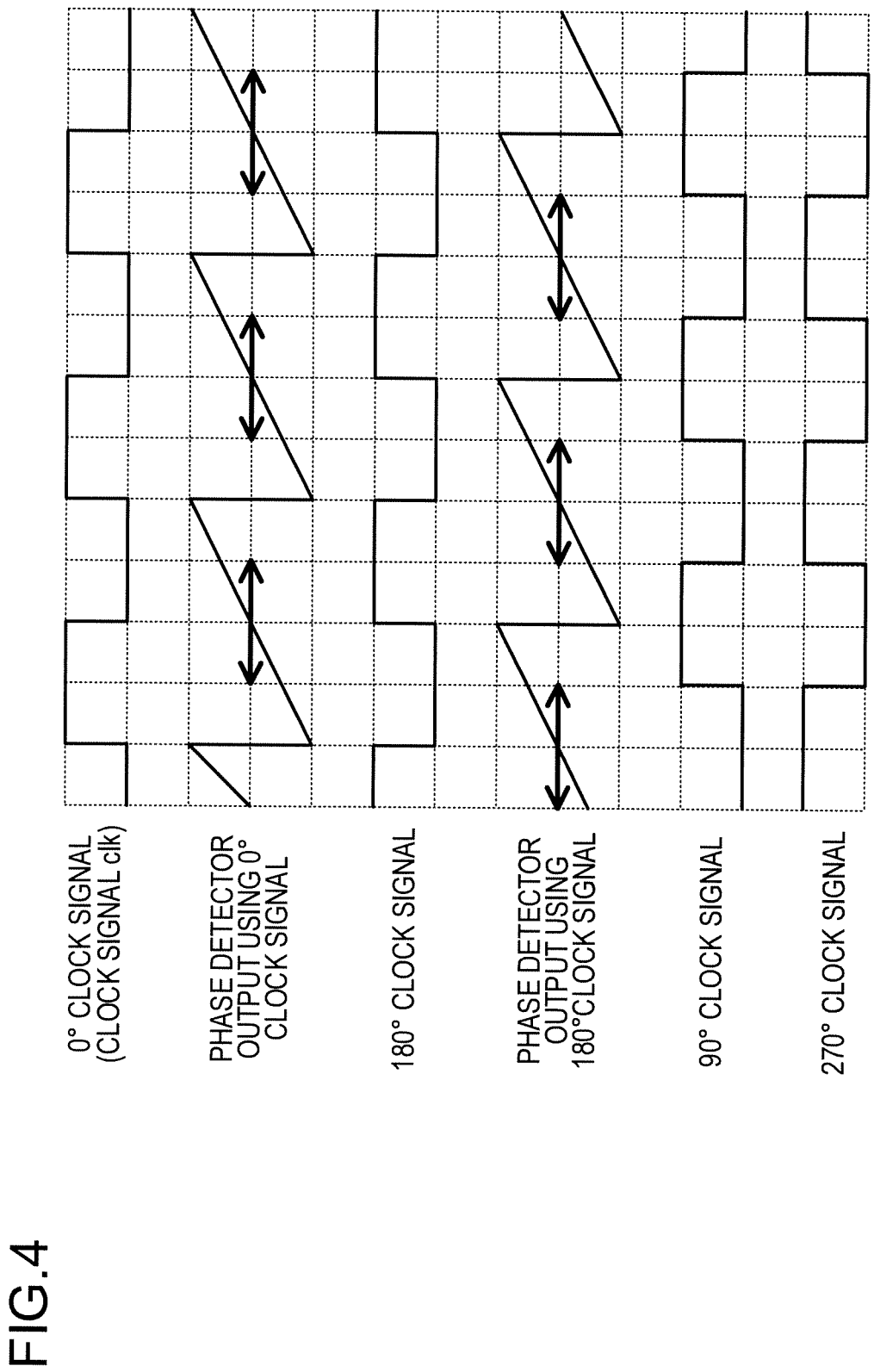
FIG. 4 is a diagram illustrating the principle of a phase detection method according to a second embodiment of the present invention.

In the second embodiment, a configuration of a time measurement device that gives consideration to those inconveniences will be described. With reference to FIG. 4, in this embodiment, the clock signal clk is referred to as a 0° clock signal. The phase of the clock signal clk is varied within the time measurement device of the second embodiment. A signal formed by inverting the clock signal clk, that is, a signal obtained by advancing the phase of the clock signal clk by 180° is referred to as a 180° clock signal. A signal formed by advancing the phase of the clock signal clk by 90° is referred to as a 90° clock signal. A signal formed by advancing the phase of the 180° clock signal by 90° is referred to as a 270° clock signal.

In the second embodiment, when the first comparison signal (for example, the signal $S_{BPFA2}$ in FIG. 2) based on the input timing of the start trigger signal has a phase from 90° to 270° relative to the 0° clock signal, the 0° clock signal is used as the second comparison signal (reference signal) to detect the phase φstr; otherwise, the 180° clock signal is used as the second comparison signal (reference signal) to detect the phase φstr. The stop trigger signal is handled likewise. Through this operation, the output signal of the phase detector is always limited within the range indicated by arrowed line segments in FIG. 4. This helps suppress the generation of one clock worth of jitter as a result of the phase difference between the first and second comparison signals becoming close to 0°, and makes it possible to detect the phases φstr and φstp in segments where good linearity is obtained. Thus, the accuracy with which the time measurement device measures the time interval $T_{INT}$ is improved.

Figure 5:
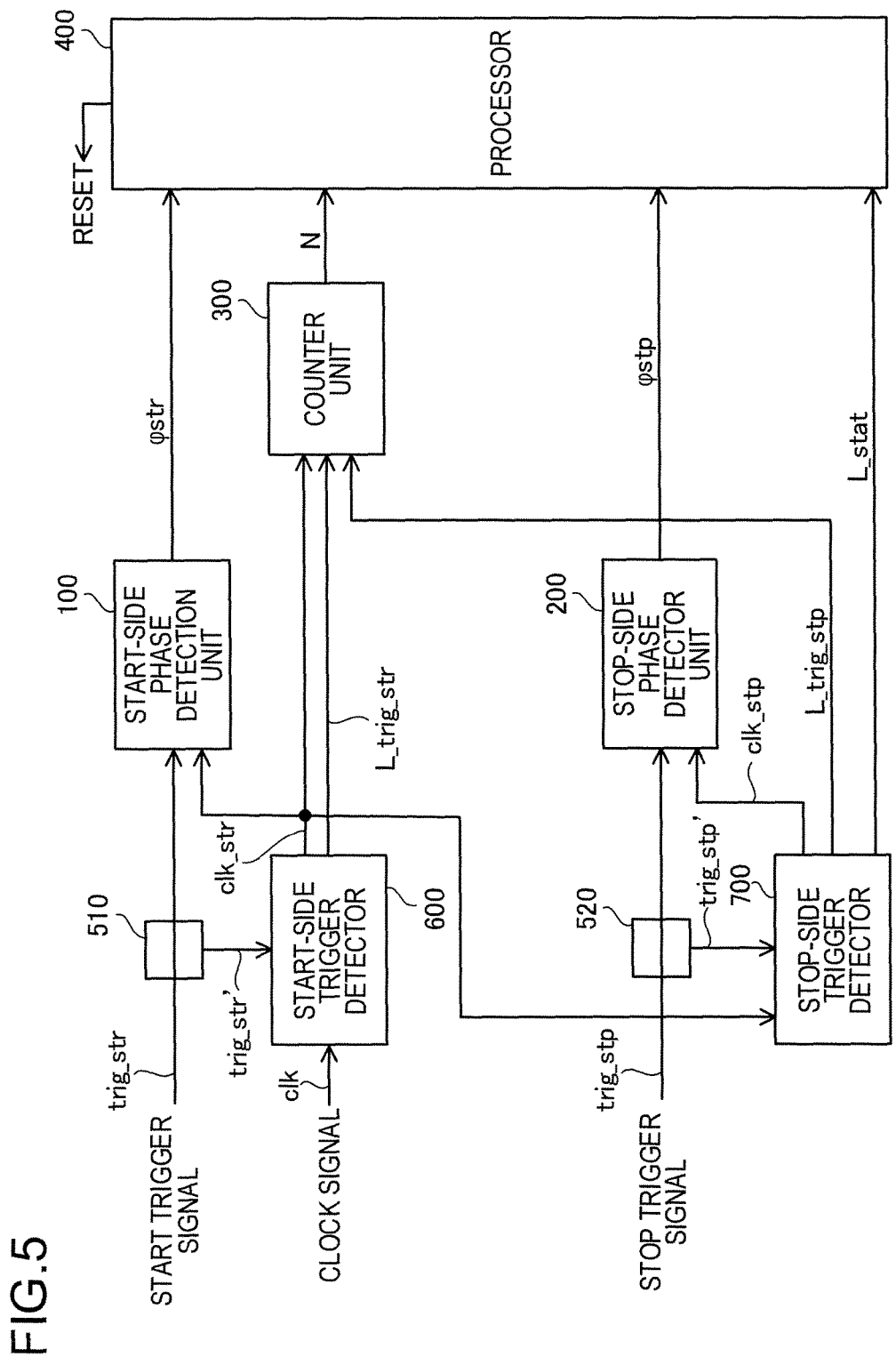
FIG. 5 is a block diagram of a time measurement device according to the second embodiment of the present invention.

FIG. 5 is a block diagram of a time measurement device according to a second embodiment. The time measurement device in FIG. 5 includes blocks identified by the reference signs 100, 200, 300, 400, 510, 520, 600, and 700.

A start trigger signal trig_str is fed to a start-side phase detection unit 100 via a signal splitter 510, and a stop trigger signal trig_stp is fed to a stop-side phase detector unit 200 via a signal splitter 520. The signal splitter 510 supplies a signal obtained by reducing the signal intensity of the start trigger signal trig_str, that is, an intensity-reduced start trigger signal trig_str', to a start-side trigger detector 600. The signal splitter 520 supplies a signal obtained by reducing the signal intensity of the stop trigger signal trig_stp, that is, an intensity-reduced stop trigger signal trig_stp', to a stop-side trigger detector 700. The signal splitters 510 and 520 are used to split signals. In a case where the output signal intensity of a band-pass filter, which will be described later, is low, it is possible, by increasing the signal intensity of the input signals (trig_str and trig_stp), to improve the signal-to-noise ratio. In that case, the signal splitters 510 and 520 can be provided with an attenuator for logic signals. Or the signal intensity of the start and stop trigger signals may be reduced within the start-side and stop-side trigger detectors 600 and 700 (in that case, the signal intensity reducing function of the signal splitters 510 and 520 may be omitted).

Figure 6:
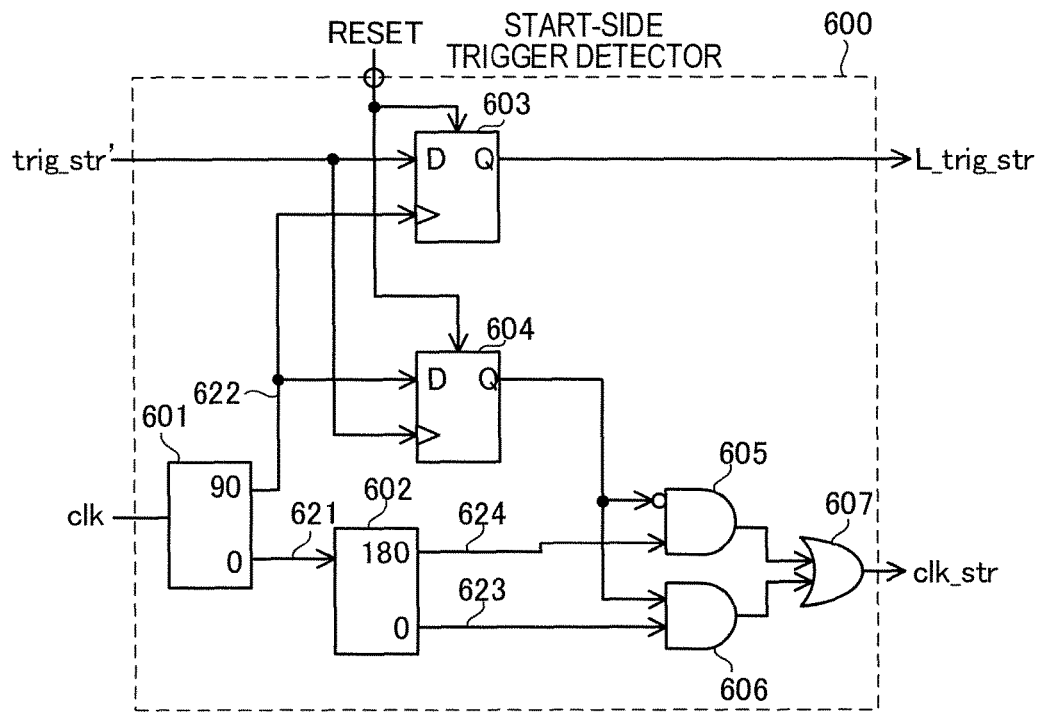
FIG. 6 is an internal configuration diagram of the start-side trigger detector in FIG. 5.

FIG. 6 is an internal configuration diagram of the start-side trigger detector 600. The start-side trigger detector 600 includes blocks identified by the reference signs 601 to 607. Supplied with the clock signal clk, a phase converter 601 outputs a 0° clock signal, which is the clock signal clk itself, as a clock signal 621, and advances the phase of the clock signal clk by 90° to generate and output a 90° clock signal as a clock signal 622. Supplied with the clock signal 621, the phase converter 602 outputs a 0° clock signal, which is the clock signal 621 itself, as a clock signal 623, and advances the phase of the clock signal 621 by 180° (that is, inverts the clock signal 621) to generate and output a 180° clock signal as a clock signal 624.

Flip-flops 603 and 604 are D flip-flops (hereinafter abbreviated to DFFs). A DFF has a clock terminal, a D terminal, a Q terminal, and a reset terminal. As is well known, in a DFF, the signal level (logic value) of a signal fed to the D terminal at an up edge timing of a signal supplied to the clock terminal is held, and a signal having the signal level (logic value) of the held signal is output from the Q terminal. When a high-level reset signal RESET is supplied to the reset terminal of the DFF, the hold is released, and the output signal at the Q terminal of the DFF becomes low level. A processor 400 (see FIG. 5) can at an arbitrary timing supply a high-level reset signal RESET to relevant parts in the time measurement device. In this embodiment, unless otherwise stated, it is assumed that no high-level reset signal RESET is being supplied to any part in the time measurement device from the processor 400.

To the D terminal and the clock terminal of the DFF 603, the start trigger signal trig_str' and the clock signal 622 are respectively fed. The output signal from the Q terminal of the DFF 603 is, as a start trigger signal L_trig_str latched synchronously with the clock signal 622, fed out of the detector 600. To the D terminal and the clock terminal of the DFF 604, the clock signal 622 and the start trigger signal trig_str' are respectively fed.

Logic circuits 605 and 606 are AND circuits (logical multiplication circuits). The AND circuits 605 and 606 are each a two-input AND circuit, and thus has a first and a second input terminal and an output terminal (the same applies to any AND circuit that will be mentioned later). To the first input terminal of the AND circuit 606, the output signal from the Q terminal of the DFF 604 is fed as it is; to the first input terminal of the AND circuit 605, an inversion signal of the output signal from the Q terminal of the DFF 604 is fed. To the second input terminals of the AND circuits 605 and 606, the clock signals 624 and 623 are respectively fed.

A logic circuit 607 is an OR circuit (logical addition circuit). The OR circuit 607 is a two-input OR circuit, and thus has a first and a second input terminal and an output terminal (the same applies to any OR circuit that will be mentioned later). To the first input terminal of the OR circuit 607, the output signal of the AND circuit 605 (that is, the logical multiplication signal between the inversion signal of the output signal from the Q terminal of the DFF 604 and the clock signal 624) is fed, and to the second input terminal of the OR circuit 607, the output signal of the AND circuit 606 (that is, the logical multiplication signal between the output signal from Q terminal of the DFF 604 and the clock signal 623) is fed.

As a result, according to the level of the output signal from the Q terminal of the DFF 604, either of the clock signals 623 and 624 is output from the output terminal of the OR circuit 607. The clock signal output from the output terminal of the OR circuit 607 is called the clock signal clk_str.

It can be said that the start-side trigger detector 600 includes a clock selector (601, 602, and 604 to 607). The clock selector outputs selectively either the clock signal 623 having the same phase as the clock signal clk or the clock signal 624 having a different phase from the clock signal clk based on the timing relationship between the start trigger signal trig_str' and the clock signal clk (more precisely, based on the relationship between the up edge timing of the start trigger signal trig_str' and the up edge timing of the clock signal clk).

Figure 7:
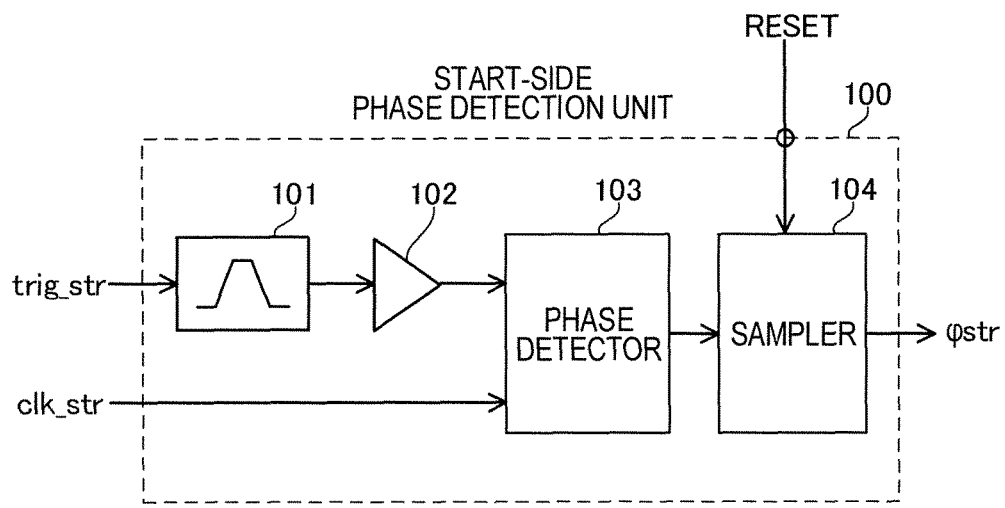
FIG. 7 is an internal configuration diagram of the start-side phase detection unit in FIG. 5.
Figure 8A:
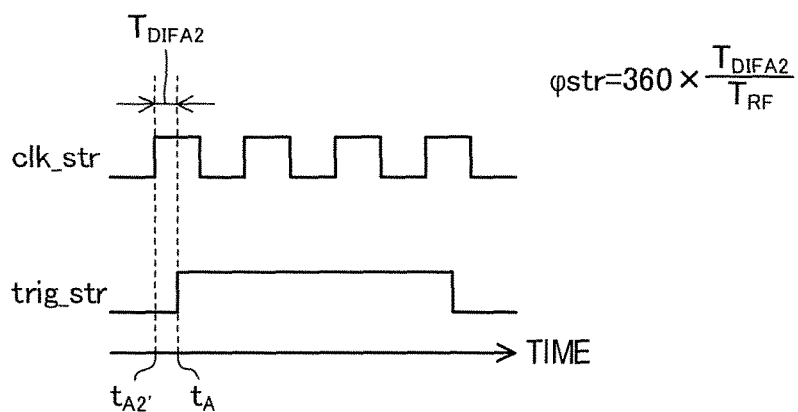
FIGS. 8A and 8B are diagrams illustrating the phases to be detected by the start-side and stop-side phase detection units in FIG. 5.
Figure 8B:
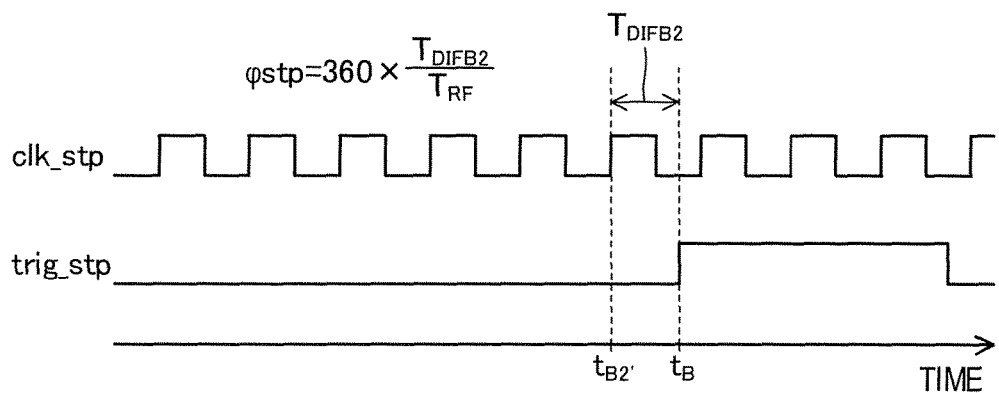
Figure 9:
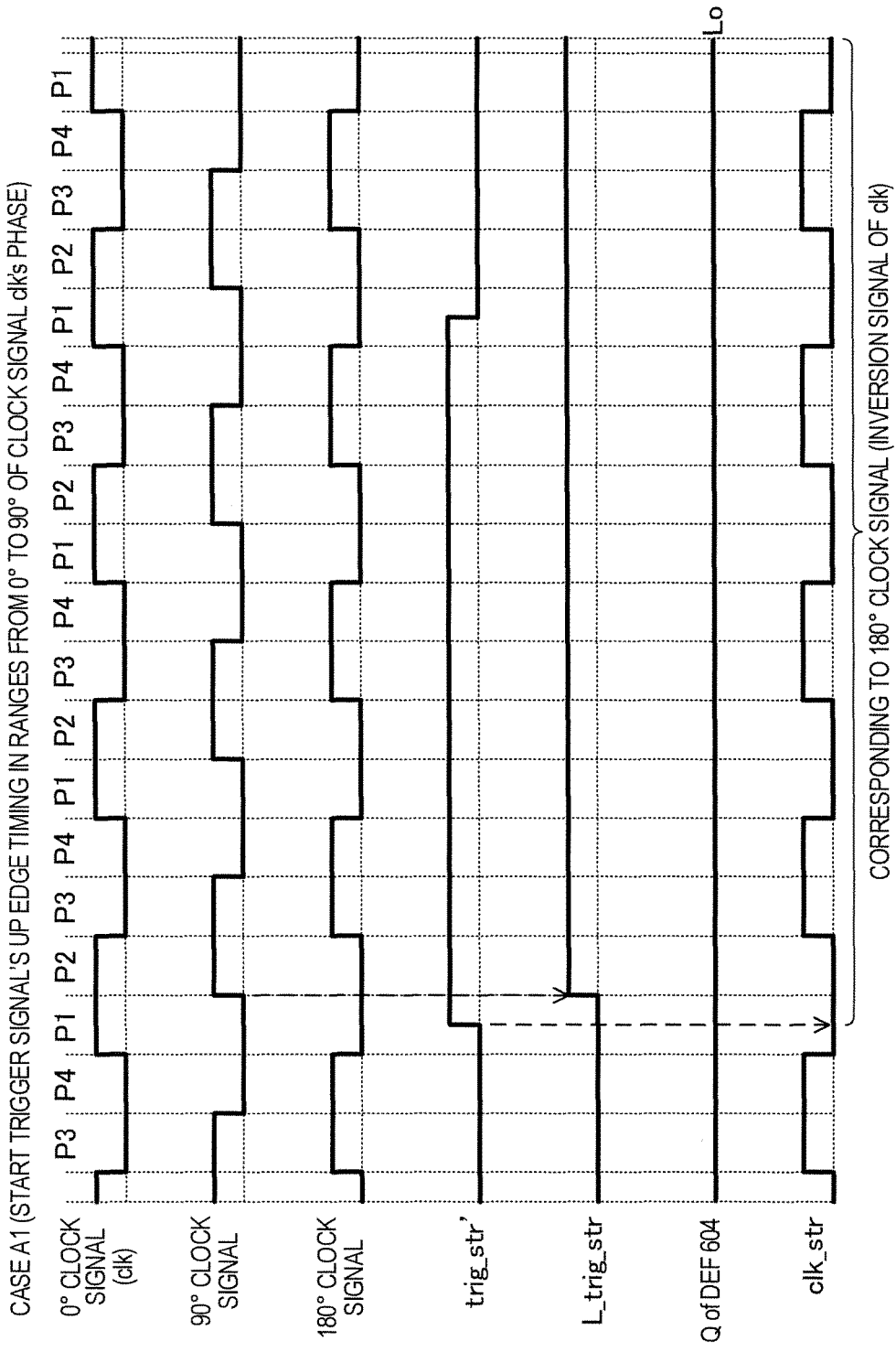
FIG. 9 is a diagram illustrating input and output signals to and from and internal signals in the start-side trigger detector in FIG. 5 where start trigger timing (trig_str') corresponds to P1 period.
Figure 10:
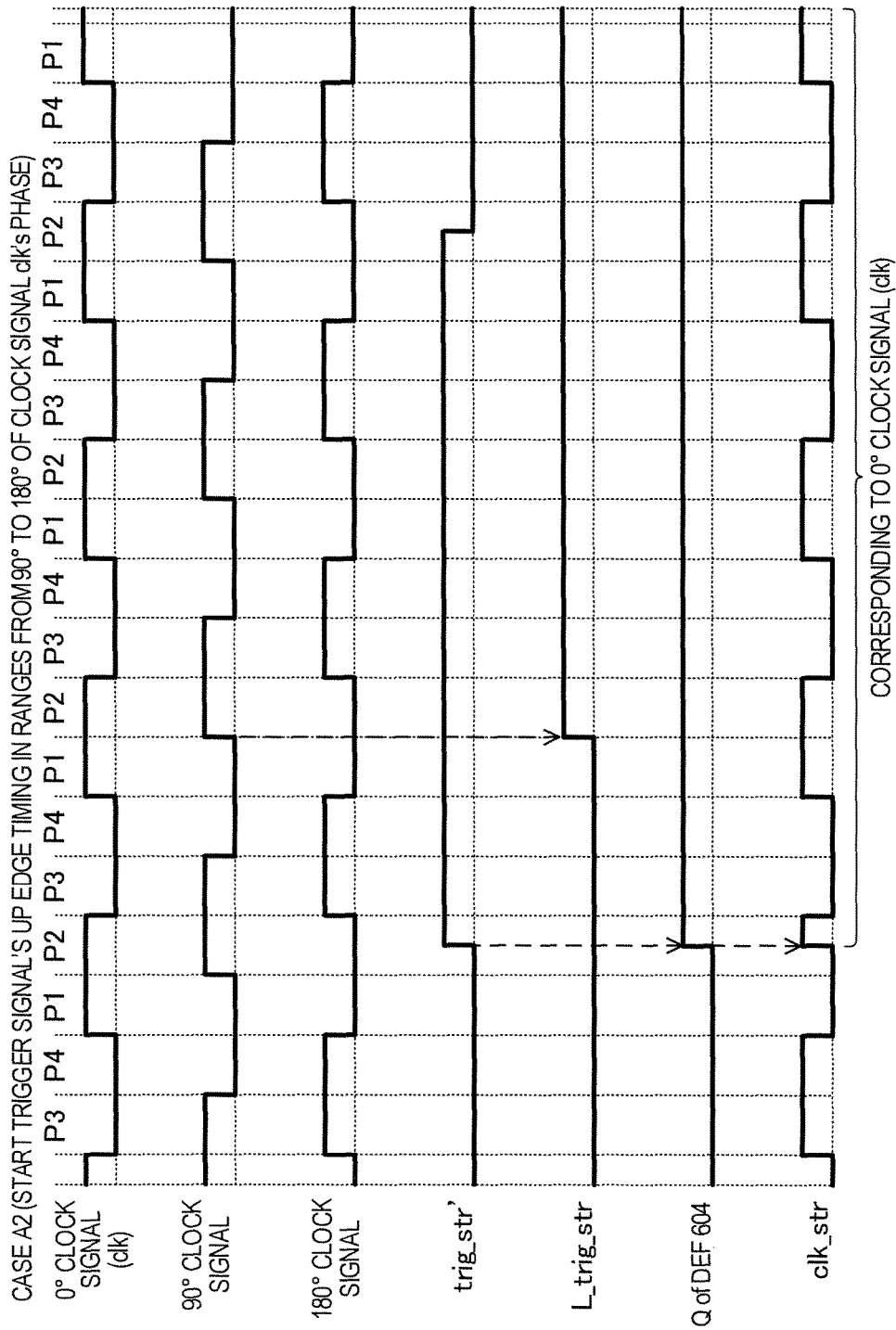
FIG. 10 is a diagram illustrating input and output signals to and from and internal signals in the start-side trigger detector in FIG. 5 where start trigger timing (trig_str') corresponds to P2 period.
Figure 11:
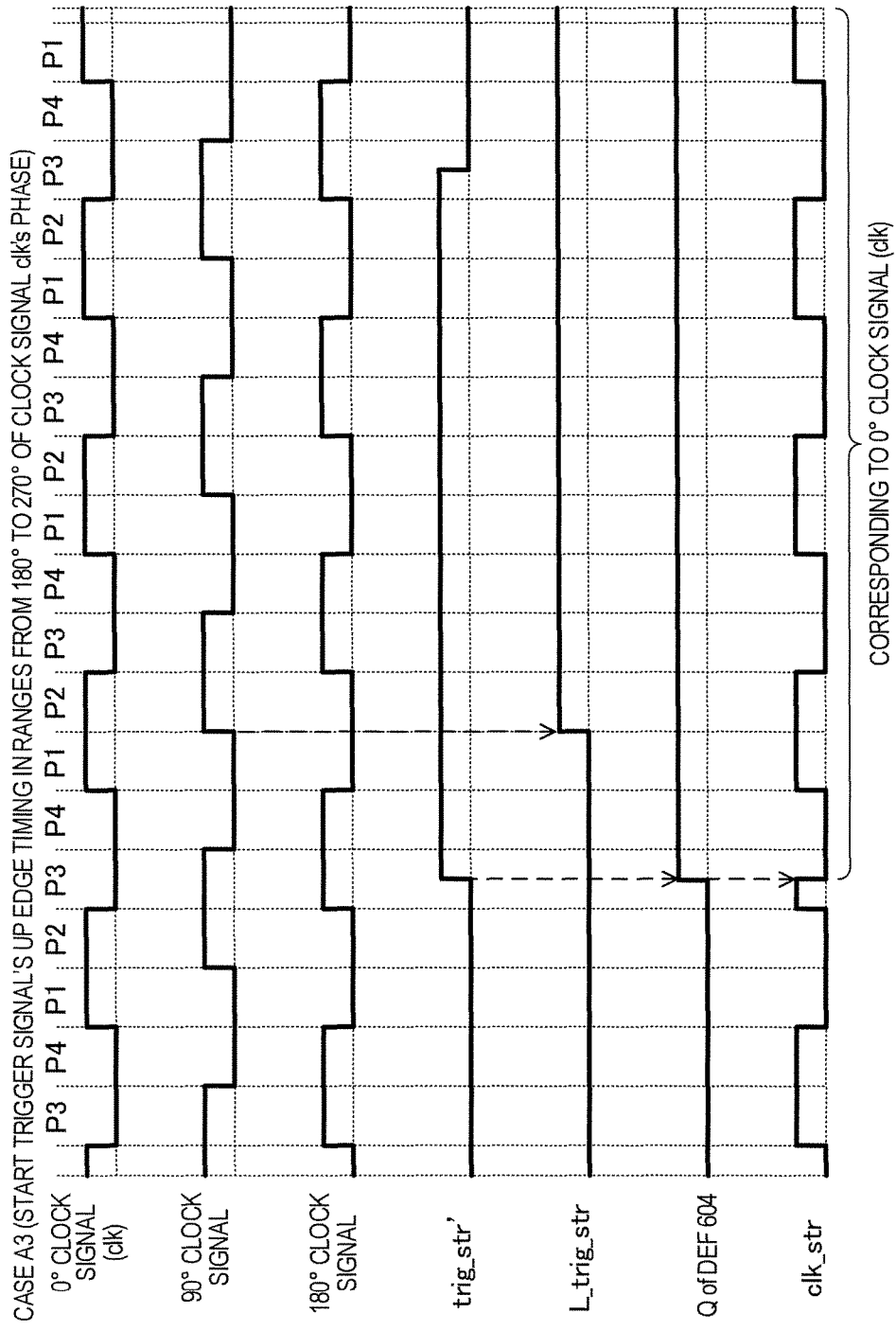
FIG. 11 is a diagram illustrating input and output signals to and from and internal signals in the start-side trigger detector in FIG. 5 where start trigger timing (trig_str') corresponds to P3 period.
Figure 12:
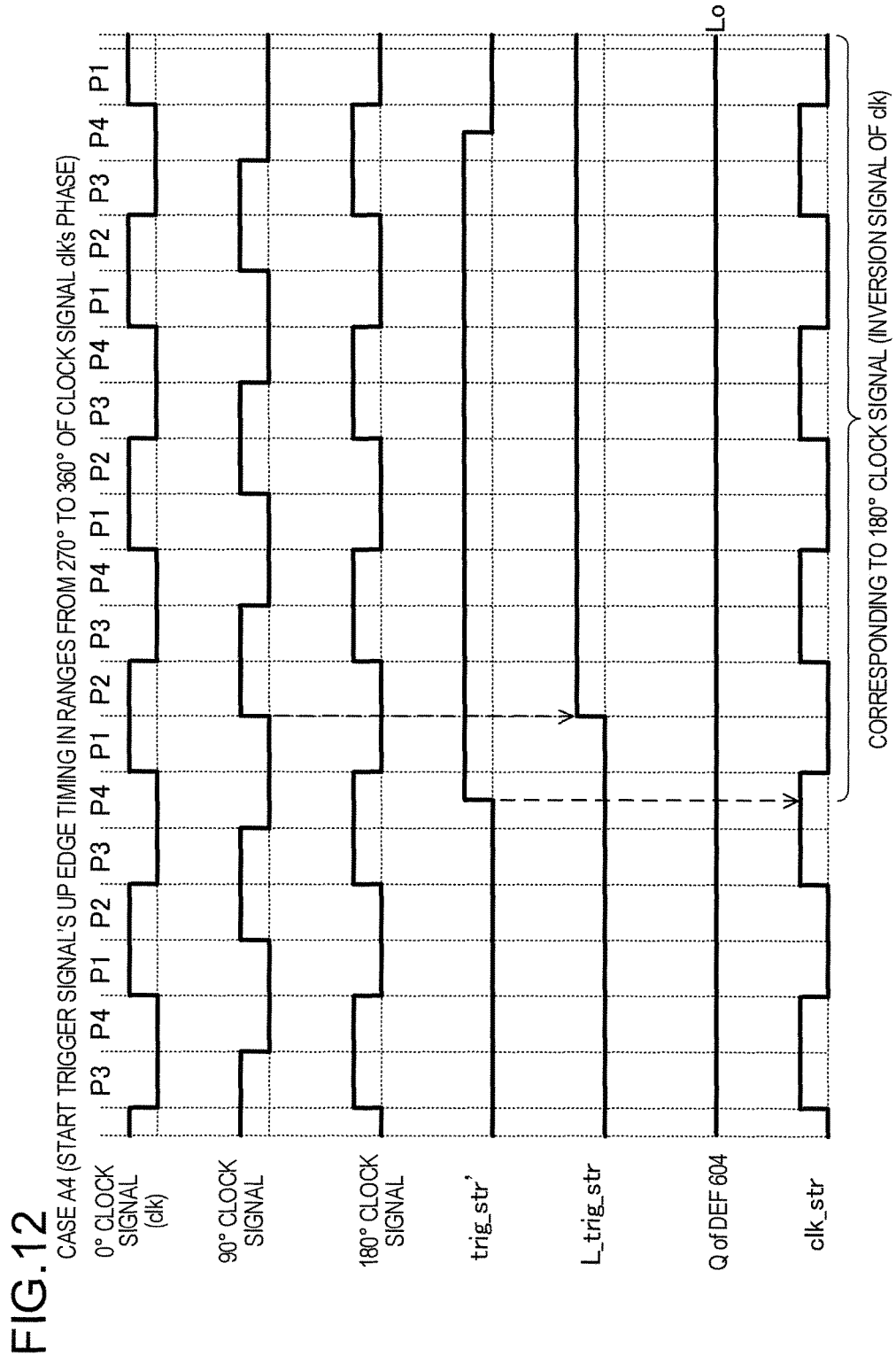
FIG. 12 is a diagram illustrating input and output signals to and from and internal signals in the start-side trigger detector in FIG. 5 where start trigger timing (trig_str') corresponds to P4 period.

FIG. 7 is an internal configuration diagram of the start-side phase detection unit 100. The start-side phase detection unit 100 includes blocks identified by the reference signs 101 to 104, and detects and outputs the phase φstr of the start trigger signal trig_str. Here, the phase φstr detected by the unit 100 is the phase of the start trigger signal trig_str with respect to the clock signal clk_str (in other words, the phase of the clock signal clk_str at the timing that the start trigger signal trig_str is fed to the time measurement device). That is (see FIG. 8(*a*)), let the time difference $T_{DIF42}$ represent the time difference between the up edge timing $t_A$ of the signal trig_str and the immediately preceding up edge timing $t_{42}'$ of the clock signal clk_str relative to the up edge timing $t_A$ of the signal trig_str, the phase φstr detected by the unit 100 equals the time difference $T_{DIF42}$ multiplied by "$360/T_{RF}$", and is given by "φstr=$360 \times T_{DIF42}/T_{RF}$". However, in a case where the up edge timing $t_A$ of the signal trig_str coincides completely with an up edge timing of the clock signal clk_str, the phase φstr is 0°.

A BPF 101 is identical with the BPF 11 (see FIG. 1) in the first embodiment. Thus, the BPF 101 extracts the signal component of the clock frequency contained in the start trigger signal trig_str to generate and output a sine-wave signal $S_{BPFA1}$ (see FIG. 2). As in the first embodiment, in the unit 100, a square-wave signal $S_{BPFA2}$ (see FIG. 2) can be generated from the sine-wave signal $S_{BPFA1}$ by use of a comparator (unillustrated).

An amplifier 102 is an amplifier that incorporates the function of the limiter 12 in FIG. 1, and keeps the amplitude of the output signal of the BPF 101 constant. The output signal of the BPF 101 is fed as a first comparison signal to a phase detector 103 via the amplifier 102. To the phase detector 103 is also fed the clock signal clk_str as a second comparison signal. The first comparison signal fed to the phase detector 103 has the same frequency as the clock signal clk_str as the second comparison signal, and thus it is possible to define a phase difference between the first and second comparison signals.

The phase detector 103 is identical with the phase detector 13 in the first embodiment. However, as mentioned above, the second comparison signal for the phase detector 103 is the clock signal clk_str. Accordingly, the phase detector 103 compares together the phases of the square-wave signal $S_{BPFA2}$ (see FIG. 2), which represents the clock frequency component of the start trigger signal trig_str, and the clock signal clk_str to detect the phase difference between them, and outputs a voltage signal having a voltage value commensurate with the detected phase difference. The square-wave signal $S_{BPFA2}$ can be generated from the sine-wave signal $S_{BPFA1}$ within the phase detector 103 or in a circuit in the stage preceding it. The phase difference detected in the phase detector 103 corresponds to the phase φstr.

A sampler 104 samples the output voltage signal of the phase detector 103 to read the value of the phase φstr, and outputs the read value (sampling value) of the phase φstr to the processor 400. The sampling timing in the sampler 104 is specified by a sampling timing setter (unillustrated) within the time measurement device. The sampling timing setter controls the sampler 104, for example, such that the output voltage signal of the phase detector 103 is sampled at the timing that a predetermined delay time (for example, a time corresponding to ($3 \times T_{RF}$)) has elapsed after an up edge timing of the clock signal clk immediately after the up edge timing of the start trigger signal (trig_str, trig_str'). When a high-level reset signal RESET is supplied from the processor 400 to the unit 100, the output signal of the sampler 104 exhibits a predetermined initial value.

With reference to FIGS. 9 to 12, the states of input/output signals to and from and internal signals in the start-side trigger detector 600 will be described. FIGS. 9 to 12 show the states of input/output signals to and from and internal signals in the start-side trigger detector 600 in cases A1 to A4 respectively. As a result of a high-level reset signal RESET from the processor 400 being fed to the detector 600, the output signals of the DFF 603 and 604 turn to low level, and thereafter the reset signal RESET turns to low level. Starting at this stage, cases A1 to A4 are assumed.

Cases A1 to A4 are cases where the up edge timing of the start trigger signal trig_str' falls in spans P1 to P4 respectively. Spans P1, P2, P3, and P4 are spans where, for the phase φclk of the clock signal clk (that is, the 0° clock signal), the inequalities "0≤φclk<90", "90≤φclk<180", "180≤φclk<270", and "270≤φclk<360" respectively hold (all inequalities in the unit of degrees). That is, dividing the span between two consecutive up edge trigger timings in the clock signal clk into four equal parts gives four spans, during which period spans P1, P2, P3, and P4 occur in this order temporally. As will be understood from the circuit configuration shown in FIG. 6, in any of cases A1 to A4, the signal level of the signal L_trig_str switches from low level to high level at the timing that, after the up edge timing of the start trigger signal trig_str', the signal level of the clock signal 622 (90° clock signal) turns from low level to high level for the first time.

The clock signal clk_str coincides with the 180° clock signal before the up edge timing of the start trigger signal trig_str', but is either of the 0° clock signal and the 180° clock signal after the up edge timing of the start trigger signal trig_str'. Specifically, the clock signal clk_str after the up edge timing of the start trigger signal trig_str' is the 0° clock signal in cases A2 and A3, and is the 180° clock signal in cases A1 and A4. Thus, the start-side phase detection unit 100 uses the 0° clock signal as the second comparison signal (reference signal) to detect the phase φstr in cases A2 and A3, and uses the 180° clock signal as the second comparison signal (reference signal) to detect the phase φstr in cases A1 and A4. In this way, it is possible, while avoiding generation of jitter as mentioned earlier, to detect the phase φstr in segments where good linearity is obtained.

Figure 13:
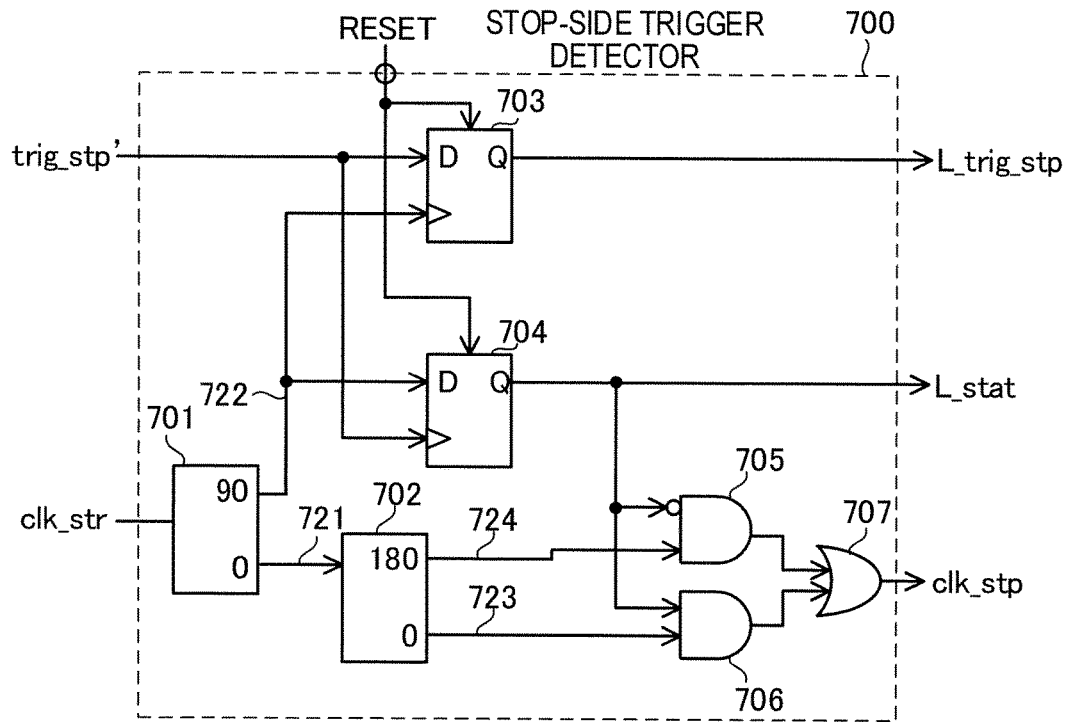
FIG. 13 is an internal configuration diagram of the stop-side trigger detector in FIG. 5.

FIG. 13 is an internal configuration diagram of the stop-side trigger detector 700. The stop-side trigger detector 700 includes blocks identified by the reference signs 701 to 707. Supplied with the clock signal clk_str, a phase converter 701 outputs the clock signal clk_str itself as a clock signal 721, and advances the phase of the clock signal clk_str by 90° to generate and output the resulting clock signal as a clock signal 722. Since the clock signal clk_str is the 0° or 180° clock signal, the clock signal 722 is a 90° or 270° clock signal. Supplied with the clock signal 721, the phase converter 702 outputs the clock signal 721 itself as a clock signal 723, and advances the phase of the clock signal 721 by 180° (that is, inverts the clock signal 721) to generate and output the resulting clock signal as a clock signal 724.

To the D terminal and the clock terminal of a DFF 703, the stop trigger signal trig_stp' and the clock signal 722 are respectively fed. The output signal from the Q terminal of the DFF 703 is, as a stop trigger signal L_trig_stp latched synchronously with the clock signal 722, fed out of the detector 700. To the D terminal and the clock terminal of a DFF 704, the clock signal 722 and the stop trigger signal trig_stp' are respectively fed.

Logic circuits 705 and 706 are AND circuits (logical multiplication circuits). To the first input terminal of the AND circuit 706, the output signal from the Q terminal of the DFF 704 is fed as it is, and to the first input terminal of the AND circuit 705, the inversion signal of the output signal from the Q terminal of the DFF 704 is fed. To the second input terminals of the AND circuits 705 and 706, the clock signals 724 and 723 are respectively fed.

A logic circuit 707 is an OR circuit (logical addition circuit). To the first input terminal of the OR circuit 707, the output signal of the AND circuit 705 (that is, the logical multiplication signal between the inversion signal of the output signal from the Q terminal of the DFF 704 and the clock signal 724) is fed, and to the second input terminal of the OR circuit 707, the output signal of the AND circuit 706 (that is, the logical multiplication signal between the output signal from the Q terminal of the DFF 704 and the clock signal 723) is fed.

As a result, according to the level of the output signal from the Q terminal of the DFF 704, either of the clock signals 723 and 724 is output from the output terminal of the OR circuit 707. The clock signal output from the output terminal of the OR circuit 707 is called the clock signal clk_stp. The output signal from the Q terminal of the DFF 704 is, as a latch state signal L_stat, fed out of the detector 700.

It can be said that the stop-side trigger detector 700 includes a clock selector (701, 702, and 704 to 707). The clock selector outputs selectively either the clock signal 723 having the same phase as the clock signal clk_str or the clock signal 724 having a different phase from the clock signal clk_str based on the timing relationship between the stop trigger signal trig_stp' and the clock signal clk_str (more precisely, based on the relationship between the up edge timing of the stop trigger signal trig_stp' and the up edge timing of the clock signal clk_str).

Figure 14:
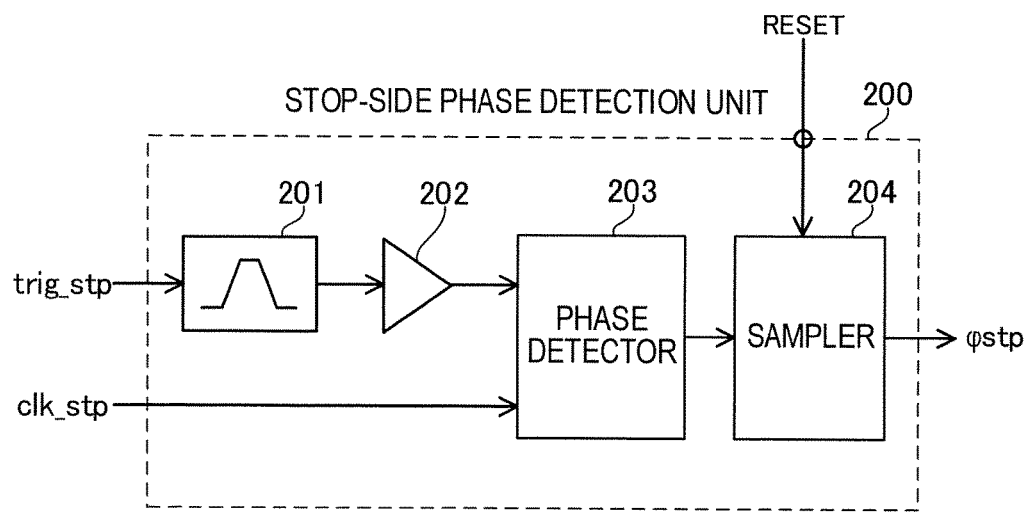
FIG. 14 is an internal configuration diagram of the stop-side phase detection unit in FIG. 5.
Figure 15:
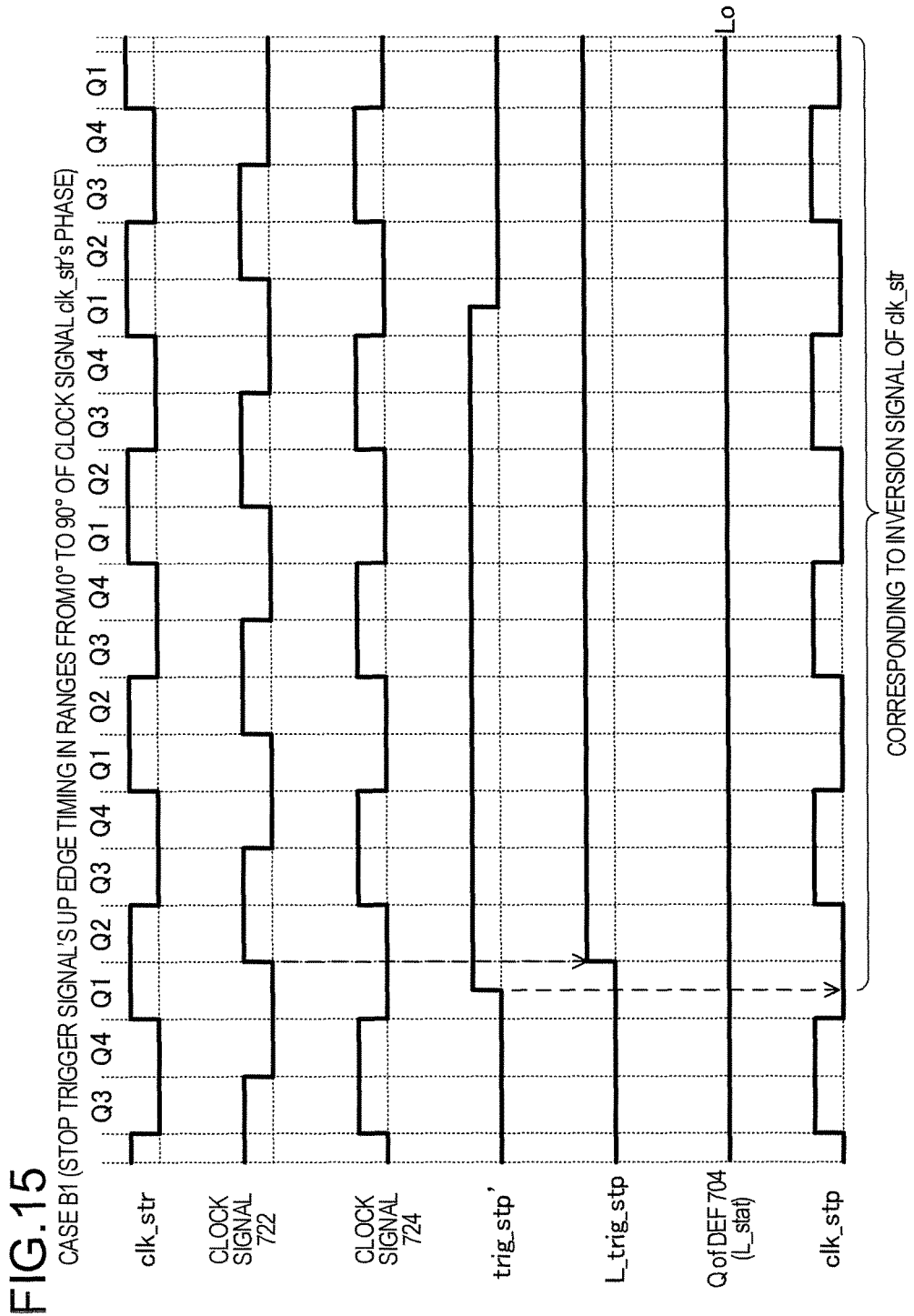
FIG. 15 is a diagram illustrating input and output signals to and from and internal signals in the stop-side trigger detector in FIG. 5 where stop trigger timing (trig_stp') corresponds to Q1 period.
Figure 16:
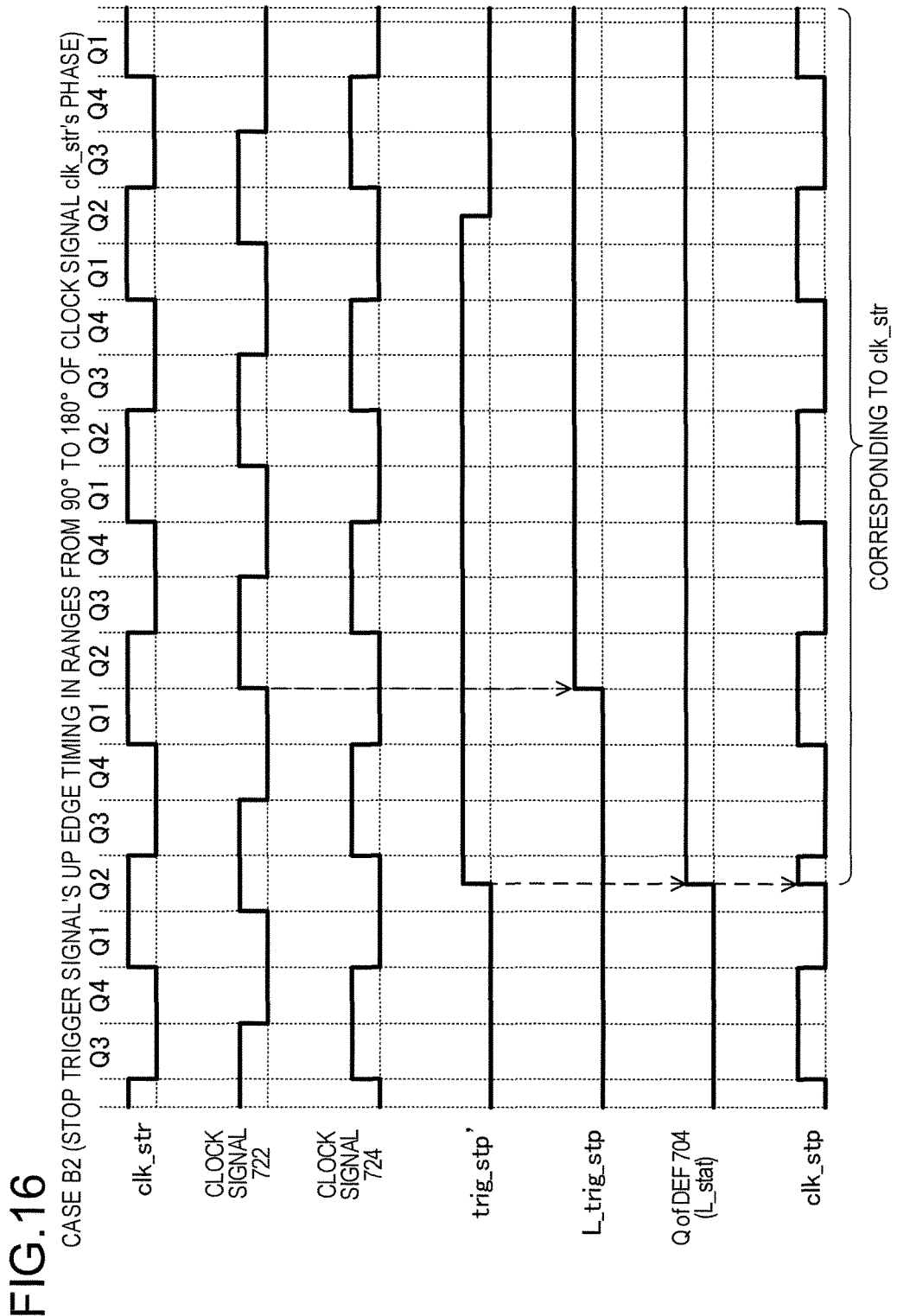
FIG. 16 is a diagram illustrating input and output signals to and from and internal signals in the stop-side trigger detector in FIG. 5 where stop trigger timing (trig_stp') corresponds to Q2 period.
Figure 17:
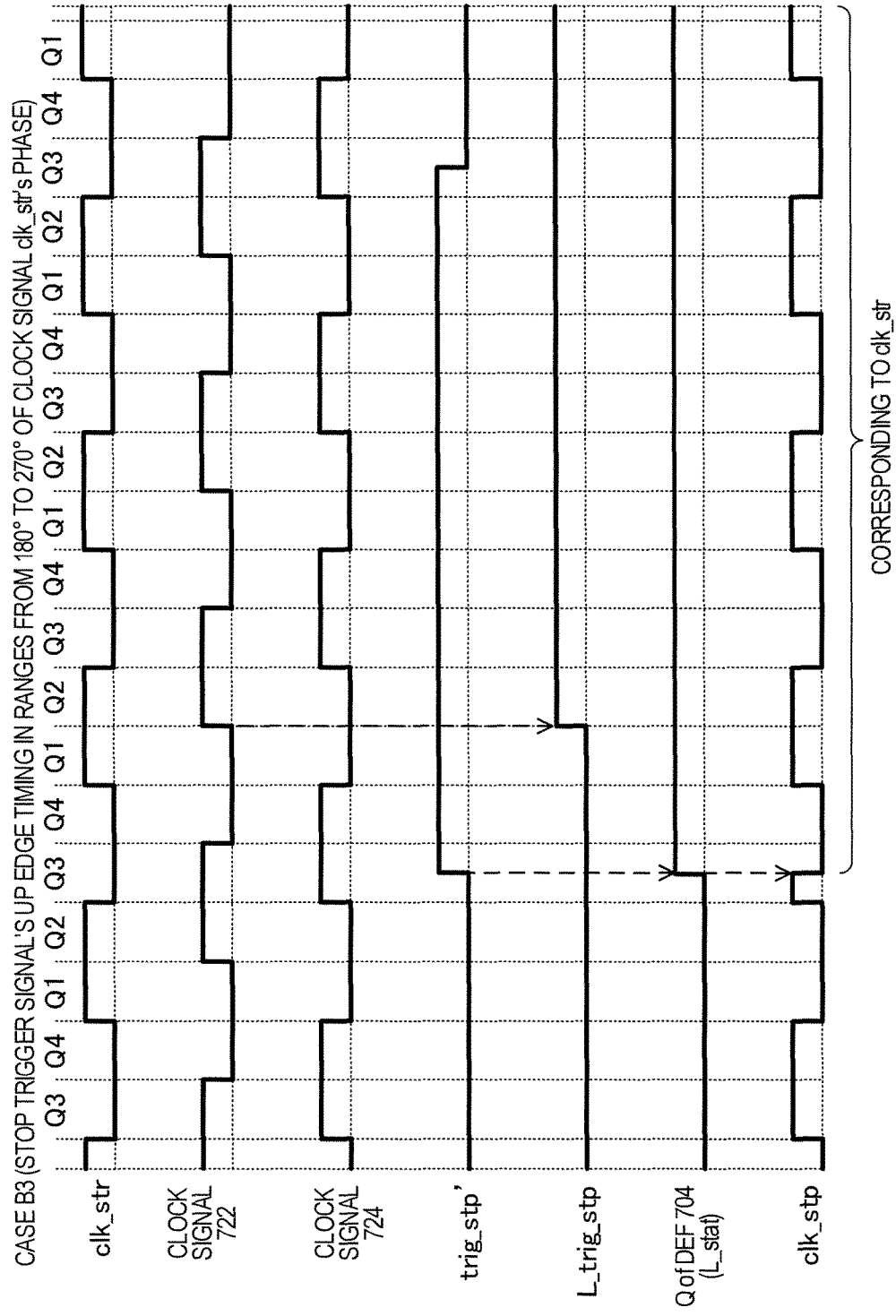
FIG. 17 is a diagram illustrating input and output signals to and from and internal signals in the stop-side trigger detector in FIG. 5 where stop trigger timing (trig_stp') corresponds to Q3 period.
Figure 18:
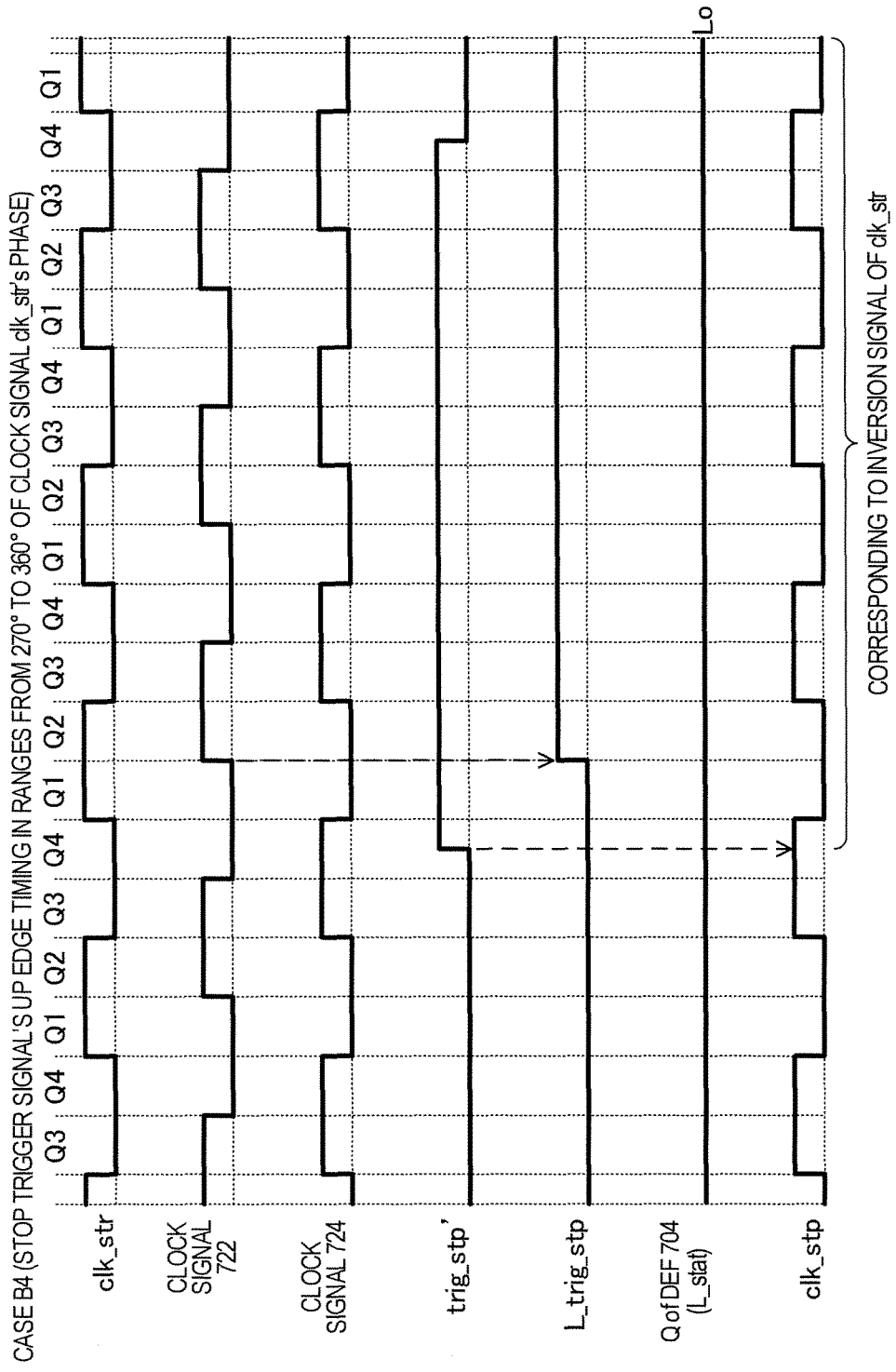
FIG. 18 is a diagram illustrating input and output signals to and from and internal signals in the stop-side trigger detector in FIG. 5 where stop trigger timing (trig_stp') corresponds to Q4 period.

FIG. 14 is an internal configuration diagram of the stop-side phase detection unit 200. The stop-side phase detection unit 200 includes blocks identified by the reference signs 201 to 204, and detects and outputs the phase φstp of the stop trigger signal trig_stp. Here, the phase φstp detected by the unit 200 is the phase of the stop trigger signal trig_stp with respect to the clock signal clk_stp (in other words, the phase of the clock signal clk_stp at the timing that the stop trigger signal trig_stp is fed to the time measurement device). That is (see FIG. 8(*b*)), let the time difference $T_{DIFB2}$ represent the time difference between the up edge timing $t_B$ of the signal trig_stp and the immediately preceding up edge timing $t_{B2}'$ of the clock signal clk_stp relative to the up edge timing is of the signal trig_stp, the phase φstp detected by the unit 200 equals the time difference $T_{DIFB2}$ multiplied by "360/$T_{RF}$", and is given by "φstp=360× $T_{DIFB2}/T_{RF}$". However, in a case where the up edge timing $t_B$ of the signal trig_stp coincides completely with an up edge timing of the clock signal clk_stp, the phase φstp is 0°.

A BPF 201 is identical with the BPF 21 (see FIG. 1) in the first embodiment. Thus, the BPF 201 extracts the signal component of the clock frequency contained in the stop trigger signal trig_stp to generate and output a sine-wave signal $S_{BPFB1}$ (see FIG. 2). As in the first embodiment, in the unit 200, a square-wave signal $S_{BPFB2}$ (see FIG. 2) can be generated from the sine-wave signal $S_{BPFB1}$ by use of a comparator (unillustrated).

An amplifier 202 is an amplifier that incorporates the function of the limiter 22 in FIG. 1, and keeps the amplitude of the output signal of the BPF 201 constant. The output signal of the BPF 201 is fed as a first comparison signal to a phase detector 203 via the amplifier 202. To the phase detector 203 is also fed the clock signal clk_stp as a second comparison signal. The first comparison signal fed to the phase detector 203 has the same frequency as the clock signal clk_stp as the second comparison signal, and thus it is possible to define a phase difference between the first and second comparison signals.

The phase detector 203 is identical with the phase detector 23 in the first embodiment. However, as mentioned above, the second comparison signal for the phase detector 203 is the clock signal clk_stp. Accordingly, the phase detector 203 compares together the phases of the square-wave signal $S_{BPFB2}$ (see FIG. 2), which represents the clock frequency component of the stop trigger signal trig_stp, and the clock signal clk_stp to detect the phase difference between them, and outputs a voltage signal having a voltage value commensurate with the detected phase difference. The square-wave signal $S_{BPFB2}$ can be generated from the sine-wave signal $S_{BPFB1}$ within the phase detector 203 or in a circuit in the stage preceding it. The phase difference detected in the phase detector 203 corresponds to the phase φstp.

A sampler 204 samples the output voltage signal of the phase detector 203 to read the value of the phase φstp, and outputs the read value (sampling value) of the phase φstp to the processor 400. The sampling timing in the sampler 204 is specified by a sampling timing setter (unillustrated) within the time measurement device. The sampling timing setter controls the sampler 204, for example, such that the output voltage signal of the phase detector 203 is sampled at the timing that a predetermined delay time (for example, a time corresponding to $(3 \times T_{RF})$) has elapsed after an up edge timing of the clock signal clk immediately after the up edge timing of the stop trigger signal (trig_stp, trig_stp'). When a high-level reset signal RESET is supplied from the processor 400 to the unit 200, the output signal of the sampler 204 exhibits a predetermined initial value.

With reference to FIGS. 15 to 18, the states of input/output signals to and from and internal signals in the stop-side trigger detector 700 will be described. FIGS. 15 to 18 show the states of input/output signals to and from and internal signals in the stop-side trigger detector 700 in cases B1 to B4 respectively. As a result of a high-level reset signal RESET from the processor 400 being fed to the detector 700, the output signals of the DFF 703 and 704 turn to low level, and thereafter the reset signal RESET turns to low level. Starting at this stage, cases B1 to B4 are assumed.

Cases B1 to B4 are cases where the up edge timing of the stop trigger signal trig_stp' falls in spans Q1 to Q4 respectively. Spans Q1, Q2, Q3, and Q4 are spans where, for the phase φclk_str of the clock signal clk_str, the inequalities "0≤φclk_str<90", "90≤φclk_str<180", "180≤φclk_str<270", and "270≤φclk_str<360" respectively hold (all inequalities in degrees). That is, dividing the span between two consecutive up edge trigger timings in the clock signal clk_str into four equal parts gives four spans, during which period spans Q1, Q2, Q3, and Q4 occur in this order temporally. As will be understood from the circuit configuration shown in FIG. 13, in any of cases B1 to B4, the signal L_trig_stp switches from low level to high level at the timing that, after the up edge timing of the stop trigger signal trig_stp', the signal level of the clock signal 722 turns from low level to high level for the first time.

The clock signal clk_stp coincides with the inversion signal of the clock signal clk_str before the up edge timing of the stop trigger signal trig_stp', but is either of the clock signal clk_str and the inversion signal of the clock signal clk_str after the up edge timing of the stop trigger signal trig_stp'. Specifically, the clock signal clk_stp after the up edge timing of the stop trigger signal trig_stp' coincides with the clock signal clk_str in cases B2 and B3, and coincides with the inversion signal of the clock signal clk_str in cases B1 and B4. Thus, the stop-side phase detection unit 200 uses the clock signal clk_str as the second comparison signal (reference signal) to detect the phase φstp in cases B2 and B3, and uses the inversion signal of the clock signal clk_str (that is, the clock signal 724) as the second comparison signal to detect the phase φstp in cases B1 and B4. In this way, it is possible, while avoiding generation of jitter as mentioned earlier, to detect the phase φstp in segments where good linearity is obtained.

Figure 19:
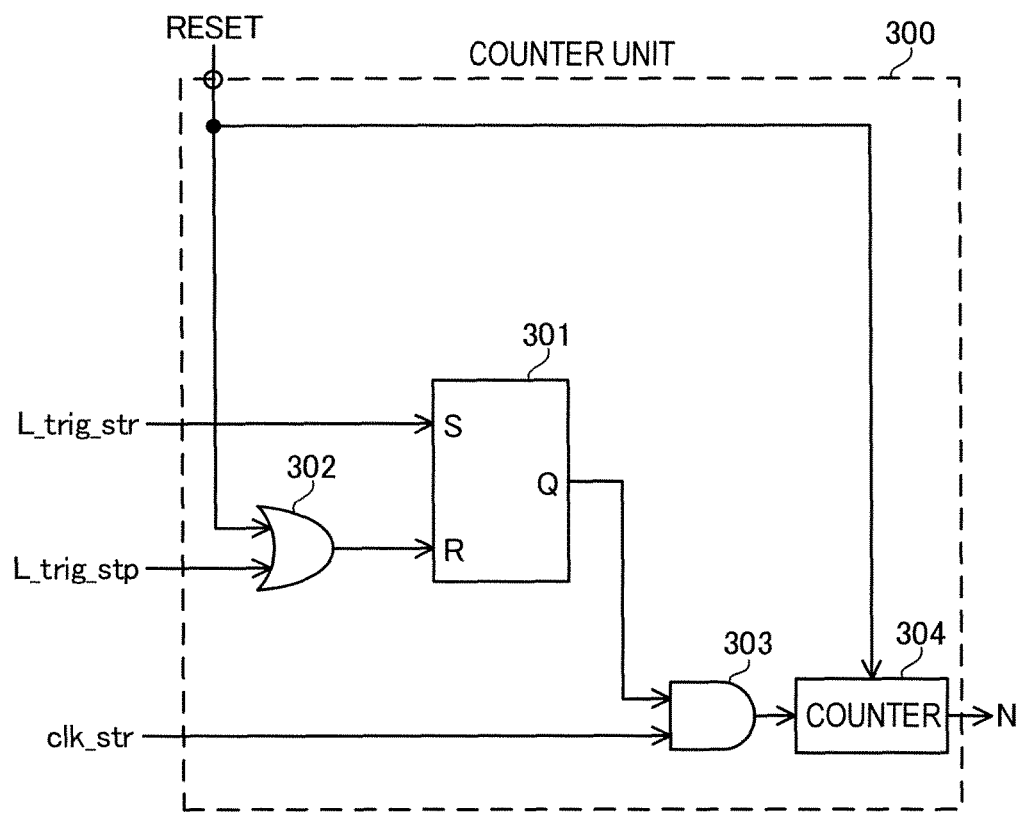
FIG. 19 is an internal configuration diagram of the counter unit in FIG. 5.

FIG. 19 is an internal configuration diagram of a counter unit 300. Like the counter unit 30 in the first embodiment, the counter unit 300 detects the time interval $T_{INT}$ in units of the clock period $T_{RF}$ (as a minimum unit). The counter unit 300 includes blocks identified by the reference signs 301 to 304. The counter unit 300, by using the clock signal clk_str and the latched start trigger signal L_trig_str from the start-side trigger detector 600 and the latched stop trigger signal L_trig_stp from the stop-side trigger detector 700, the number of clocks N in the clock signal between the input timings of the start and stop trigger signals L_trig_str and L_trig_stp. Here, the number of clocks N counted by the counter unit 300 is the number of clocks in the clock signal clk_str. More specifically, the counter unit 300 counts how many up edges there are in the clock signal clk_str after the up edge timing of the start trigger signal L_trig_str and before the up edge timing of the stop trigger signal L_trig_stp, and detects the count value as the number of clocks N.

The internal configuration of the counter unit 300 will now be described in detail. A flip-flop 301 is an RS flip-flop (hereinafter abbreviated to RSFF). An RSFF has a set terminal, a reset terminal, and a Q terminal. As is well known, in an RSFF, when input signals to the set and reset terminals are at high and low levels respectively, the output signal from the Q terminal is kept at high level; when input signals to the set and reset terminals are at low and high levels respectively, the output signal from the Q terminal is kept at low level; when input signals to the set and reset terminals are both at low level, the output signal level at the Q terminal is kept unchanged. It is assumed that the RSFF 301 is designed such that, when a high-level signal is fed to the reset terminal, irrespective of the input signal level at the set terminal, the output signal level at the Q terminal is at low level.

An OR circuit 302 feeds the logical addition signal between the reset signal RESET from the processor 400 and the latched stop trigger signal L_trig_stp to the reset terminal of the RSFF 301. To the set terminal of the RSFF 301, the latched start trigger signal L_trig_str is fed. An AND circuit 303 feeds the logical multiplication signal between the output signal from the Q terminal of the RSFF 301 and the clock signal clk_str to a counter 304. Thus, between the up edge timings of the signals L_trig_str and L_trig_stp, the clock signal clk_str is fed from the AND circuit 303 to the counter 304. The counter 304 counts the number of up edges in the signal fed from the AND circuit 303, and outputs the count value as the number of clocks N. As a result, the number of up edges in the clock signal clk_str between the up edge timings of the signals L_trig_str and L_trig_stp is detected as the number of counts N.

Before the start trigger signal trig_str is fed to the time measurement device, the 400 supplies a high-level reset signal RESET to the counter unit 300 to turn the signal that the RSFF 301 holds and outputs to low level and bring the counter 304 into an initial state (initialize the count value N of the counter 304 to zero). Thereafter, the processor 400 turns the reset signal RESET to low level, in which state the start and stop trigger signals trig_str and trig_stp are fed successively to the time measurement device.

The processor 400 comprises a processing device such as a microprocessor, and derives the time interval $T_{INT}$ at a resolution finer than the clock period $T_RF$ based on the phases φstr and φstp detected by the units 100 and 200 (that is, the values of the phases φstr and φstp obtained from the samplers 104 and 204) and the count number N detected by the counter unit 300. The definition of the time interval $T_{INT}$ is as described in connection with the first embodiment. That is, the time interval $T_{INT}$ is the time difference between the up edge timing $t_0$ of the start trigger signal trig_str and the up edge timing $t_B$ of the stop trigger signal trig_stp (see FIG. 2). Specifically, the processor 400 calculates the time interval $T_{INT}$ according to equation (2) below.

$$T_{INT}=T_{RF}\times(N+INVL\_stat/2)+T_{RF}\times(\varphi stp-\varphi str)/360 \quad (2)$$

The right side of equation (2) results from adding "$T_{RF}\times$INVL_stat/2" to the right side of equation (1) noted in connection with the first embodiment. In equation (2), "INVL_stat" has the inverted value of the logical value of the latch state signal L_stat (the same applies to equation (2a) noted later). However, the latch state signal L_stat, which determines the value of the "INVL_stat", is the latch state signal L_stat that is output from the Q terminal after the DFF 704 in FIG. 13 latches the input signal at the D terminal at the up edge timing of the stop trigger signal trig_stp'. When the latch state signal L_stat is at high level, the clock signal clk_stp (clock signal 723; see FIG. 13) having the same phase as the clock signal clk_str used in the start-side phase detection unit 100 is used in the stop-side phase detector unit 200, and thus "INVL_stat=0". On the other hand, when the latch state signal L_stat is at low level, the clock signal clk_stp (clock signal 724; see FIG. 13) having a phase 180° advanced relative to the clock signal clk_str used in the start-side phase detection unit 100 is used in the stop-side phase detector unit 200, and thus, to give consideration to the advance in phase in the processor 400, "INVL_stat=1".

According to the second embodiment, as with the first embodiment, it is possible to measure the time interval between trigger signals at such a high resolution as is difficult to achieve with the conventional configuration in FIG. 20. Moreover, it is possible, without depending on the input timings of the start and stop trigger signals trig_str and trig_stp, to reliably avoid generation of one clock worth of jitter, and also to detect the phases φstr and φstp in segments where good linearity is obtained, ensuring high-accuracy time interval measurement.

In a case where it is previously determined that the start trigger signal trig_str is synchronous with the 180° clock signal, that is, in a case where it is previously determined that the up edge timing $t_A$ of the start trigger signal trig_str coincides with an up edge timing of the 180° clock signal, the start-side phase detection unit 100 and the start-side trigger detector 600 may be omitted from the time measurement device. In that case, the signals clk and trig_str' themselves are handled as the signals clk_str and L_trig_str respectively, and are fed to the counter unit 300 and the stop-side trigger detector 700, and the processor 400 calculates the time interval $T_{INT}$ according to equation (2a).

$$T_{INT}=T_{RF}\times(N+INVL\_stat/2)+T_{RF}\times\varphi stp/360 \quad (2a)$$

Likewise, in a case where it is previously determined that the stop trigger signal trig_stp is synchronous with the 180° clock signal, that is, in a case where it is previously determined that the up edge timing $t_B$ of the stop trigger signal trig_stp coincides with an up edge timing of the 180° clock signal, the stop-side phase detection unit 200 and the stop-side trigger detector 700 may be omitted from the time measurement device. In that case, with the configuration shown in FIG. 5 taken as a reference, to the counter unit 300 are fed, instead of the clock signal clk_str, the clock signal clk and, instead of the signal L_trig_stp, the signal trig_stp (or trig_stp'). To the start-side phase detection unit 100 is fed the clock signal clk_str such that the phase reading range is from 90° to 270°. Then the processor 400 can calculate the time interval $T_{INT}$ according to equation (2b). Here, it is assumed that the counter unit 300 (counter 304) counts the up edge of the clock signal clk_str at the timing $t_B$. In equation (2b), INVL_stat has the inverted value of the logical value of the signal output from the Q terminal of the DFF 604 in FIG. 6 after the DFF 604 latches the input signal 622 at the D terminal at the up edge timing of the start trigger signal trig_str' (Accordingly, when this signal is at high level, INVL_stat in equation (2b) has a value of 0, and when that signal is at low level, INVL_stat in equation (2b) has a value of 1).

$$T_{INT}=T_{RF}\times(N-INVL\_stat/2)-T_{RF}\times(360-\varphi str)/360 \quad (2b)$$

<<Study on Embodiments of the Present Invention>>

To follow is a study on the technology relating to the present invention as implemented in the first and second embodiments.

A time measurement device of configuration $J_1$ according to one aspect of the present invention is a time measurement device for measuring the time interval ($T_{INT}$) between the input timings ($t_A$, $t_B$) of a first and a second target signal each being a pulsed signal, and it includes: a number-of-periods detector (30, 300) which, by using a clock signal with a predetermined clock frequency and a predetermined clock period, detects the time interval in units of the clock period; a phase detection unit including a band-pass filter, wherein the band-pass filter receives at least one of the first and second target signals as a filtering target signal and extracts a signal component of the clock frequency from the filtering target signal, and the phase detection unit detects the phase difference between the extracted signal and the clock signal; and a processor (40, 400) which, by using a result (N) detected by the number-of-periods detector and the phase difference (φstr, φstp) detected by the phase detection unit, derives the time interval at a resolution finer than the clock period.

The filtering target signal, which is a pulsed signal, contains signal components of different frequencies including the clock frequency, and thus, by use of a band-pass filter, the signal component of the clock frequency can be extracted from the filtering target signal. The phase difference between the extracted signal and the clock signal represents a time component shorter than the clock period within the time interval, and thus, by use of the result detected by the number-of-periods detector and the phase difference detected by the phase detection unit, the time interval can be derived at a resolution finer than the clock period. In measuring the time component shorter than the clock period within the time interval, there is no need to rely on a component such as a switch SW (FIG. 20), and thus the time interval can be measured with high accuracy.

The first and second target signals correspond to, in the first and second embodiments, the start and stop trigger signals. Here, both the start trigger signal trig_str and the intensity-reduced start trigger signal trig_str' belong to the first target signal, and both the stop trigger signal trig_stp and the intensity-reduced stop trigger signal trig_stp' belong to the second target signal.

In the first embodiment, when it is unknown whether or not the start and stop trigger signals are synchronous with the clock signal, equation (1) noted above is used, and the start and stop trigger signals as the first and second target signals behave as filtering target signals respectively.

Specifically, for example, in connection with the first embodiment, in a time measurement device of configuration $J_9$, which belongs to the configuration $J_1$, the phase detection unit includes: a first phase detection unit (10) including a first band-pass filter (11), wherein the first band-pass filter extracts as a first extracted signal a signal component of the clock frequency from the first target signal (trig_str), and the first phase detection unit detects the phase difference (φstr) between the first extracted signal and the clock signal; and a second phase detection unit (20) including a second band-pass filter (21), the second band-pass filter extracts as a second extracted signal a signal component of the clock frequency from the second target signal, and the second phase detection unit detects the phase difference (φstp) between the second extracted signal and the clock signal. The processor (40) can then derive the time interval ($T_{INT}$) at the resolution finer than the clock period by using the result (N) detected by the number-of-periods detector (30) and the phase differences (φstr, φstp) detected by the first and second phase detection units In the first embodiment, in a case where it is determined that the start or stop trigger signal is synchronous with the clock signal, equation (1a) or (1b) noted above can be used, and feeding one of the start and stop trigger signals as the filtering target signal to the band-pass filter (11 or 21) suffices.

In the second embodiment, when it is unknown whether or not the start and stop trigger signals are synchronous with the clock signal, equation (2) noted above is used, and the start and stop trigger signals as the first and second target signals behave as filtering target signals respectively.

Specifically, for example, in connection with the second embodiment, in a time measurement device of configuration $J_5$, which belongs to the configuration $J_1$, there are further provided a first clock selector (601, 602, 604 to 607; see FIG. 6) which outputs, based on the timing relationship between the first target signal and an original clock signal (clk) having the clock frequency, selectively either a clock signal (623; clk_str) having a same phase as the original clock signal or a clock signal (624; clk_str) having a different phase from the original clock signal; and a second clock selector (701, 702, 704 to 707; see FIG. 13) which outputs, based on the timing relationship between the second target signal and an output clock signal (clk_str) of the first clock selector, selectively either a clock signal (723; clk_stp) having a same phase as the output clock signal (clk_str) of the first clock selector or a clock signal (724; clk_stp) having a different phase from the output clock signal (clk_str) of the first clock selector. The phase detection unit includes: a first phase detection unit (100) including a first band-pass filter (101), wherein the first band-pass filter extracts a signal component of the clock frequency from the first target signal, and the first phase detection unit detects the phase difference (φstr) between the extracted signal of the first band-pass filter and the output clock signal (clk_str) of the first clock selector; and a second phase detection unit (200) including a second band-pass filter (201), wherein the second band-pass filter extracts a signal component of the clock frequency from the second target signal, and the second phase detection unit detects the phase difference between the extracted signal of the second band-pass filter and the output clock signal (clk_stp) of the second clock selector. The processor (400) can then derive the time interval ($T_{INT}$) at the resolution finer than the clock period by using the result (N) detected by the number-of-periods detector and the phase differences (φstr, φstp) detected by the first and second phase detection units.

By providing the first and second clock selectors and configuring the first and second phase detection units as described above, a clock signal having a phase suitable for phase difference detection can be used selectively. It is thus possible to avoid generation of one clock worth of jitter, and to detect the phase difference (φstr, φstp) in segments where good linearity is obtained, ensuring high-accuracy time interval measurement.

More specifically, for example, in connection with the second embodiment, in a time measurement device of configuration $J_6$, which belongs to the configuration $J_5$, the first clock selector (601, 602, 604 to 607; see FIG. 6) can output, based on the timing relationship between the first target signal and the original clock signal (clk), selectively either the clock signal (623; clk_str) having the same phase as the original clock signal or a clock signal (624; clk_str) resulting from inverting the phase of the original clock signal, and the second clock selector (701, 702, 704 to 707; see FIG. 13) can output, based on the timing relationship between the second target signal and the output clock signal (clk_str) of the first clock selector, selectively either the clock signal (723; clk_stp) having the same phase as the output clock signal of the first clock selector or a clock signal (724; clk_stp) resulting from inverting the phase of the output clock signal of the first clock selector.

Still more specifically, for example, in connection with the second embodiment, in a time measurement device of configuration $J_7$, which belongs to the configuration $J_6$, the measured time interval ($T_{INT}$) is the length of time between the timing ($T_A$) at which the signal level of the first target signal shifts from a first predetermined level to a second predetermined level and the timing ($T_B$) at which the signal level of the second target signal shifts from the first predetermined level to the second predetermined level. The first clock selector (601, 602, 604 to 607; see FIG. 6) can output the clock signal (0° clock signal) having the same phase as the original clock signal when the timing (the up edge timing of trig_str' in FIGS. 9 to 12) at which the signal level of the first target signal shifts from the first predetermined level to the second predetermined level falls in the range from 90° to 270° (P2 or P3; see FIGS. 10 and 11) in terms of the phase of the original clock signal (clk) (cases A2 and A3; see FIGS. 10 and 11), and can otherwise (cases A1 and A4; see FIGS. 9 and 12) output the clock signal (180° clock signal) resulting from inverting the phase of the original clock signal. The second clock selector (701, 702, 704 to 707; see FIG. 13) can output the clock signal having the same phase as the output clock signal (clk_str) of the first clock selector when the timing (the up edge timing of trig_stp' in FIGS. 15 to 18) at which the signal level of the second target signal shifts from the first predetermined level to the second predetermined level falls in the range (Q2 or Q3; see FIGS. 16 and 17) from 90° to 270° in terms of the phase of the output clock signal (clk_str) of the first clock selector (cases B2 and B3; see FIGS. 16 and 17), and can otherwise (cases B1 and B4; see FIGS. 15 and 18) output the clock signal (the inversion signal of clk_str) resulting from inverting the phase of the output clock signal of the first clock selector.

Thus, when the timing at which the signal level of the first target signal shifts from the first predetermined level to the second predetermined level falls in the range from 90° to 270° in terms of the phase of the original clock signal (clk) (cases A2 and A3; see FIGS. 10 and 11), the first clock selector outputs the clock signal (0° clock signal) having the same phase as the original clock signal, and at this time, the phase difference (φstr) detected by the first phase detection unit falls in the range from 90° to 270°. This is because the first phase detection unit detects the phase difference (φstr) by using the output clock signal (0° clock signal, that is, clk) of the first clock selector.

On the other hand, when the timing at which the signal level of the first target signal shifts from the first predetermined level to the second predetermined level does not fall in the range from 90° to 270° in terms of the phase of the original clock signal (clk) (cases A1 and A4; see FIGS. 9 and 12), the first clock selector outputs the clock signal (180° clock signal) resulting from inverting the phase of the original clock signal, and also at this time, the phase difference (φstr) detected by the first phase detection unit falls in the range from 90° to 270°. This is because the first phase detection unit detects the phase difference (φstr) by using the output clock signal (180° clock signal, that is, the inversion signal of clk) of the first clock selector.

For similar reasons, in configuration $J_7$ described above, also the phase difference (φstp) detected by the second phase detection unit falls in the range from 90° to 270°. By adjusting the phase of the clock signal for phase difference detection such that the detected phase difference falls in the range from 90° to 270°, it is possible to reliably avoid generation of one clock worth of jitter, and to detect the phase difference (φstr, φstp) in segments where good linearity is obtained, ensuring high-accuracy time interval measurement.

Although in the second embodiment, the first and second levels are high and low levels respectively, the relationship may be the other way around. The same applies also to the first embodiment.

For another example, in connection with the second embodiment, in a time measurement device of configuration $J_8$, which belongs to the configurations $J_5$ to $J_7$, the number-of-periods detector (300) can detect the time interval in units of the clock frequency by using a signal (L_trig_str) based on the first target signal and the original clock signal (clk) and a signal (L_trig_stp) based on the second target signal and the output clock signal (clk_str) of the first clock selector.

In the second embodiment, in a situation where it is determined that the start or stop trigger signal is synchronous with the clock signal clk, equation (2a) or (2b) noted above can be used, and feeding one of the start and stop trigger signals as the filtering target signal to the band-pass filter (101 or 201) suffices.

With such a situation taken into consideration, in connection with the second embodiment, in a time measurement device of configuration $J_2$, which belongs to the configuration $J_1$, there may be further provided a clock selector (601, 602, and 604 to 607 in FIG. 6, or 701, 702, and 704 to 707 in FIG. 13) which outputs, based on the timing relationship between the filtering target signal (start or stop trigger signal) and a reference clock signal (clk or clk_str) having the clock frequency, selectively either a clock signal having the same phase as the reference clock signal or a clock signal having a different phase from the reference clock signal. The phase detection unit (100 or 200) can then detect the phase difference (φstr or φstp) between the extracted signal of the band-pass filter (101 or 201) and an output clock signal (clk_str or clk_stp) of the clock selector.

By providing the clock selector and configuring the phase detection unit as described above, a clock signal having a phase suitable for phase difference detection can be used selectively. It is thus possible to avoid generation of one clock worth of jitter, and to detect the phase difference (φstr or φstp) in segments where good linearity is obtained, ensuring high-accuracy time interval measurement.

More specifically, in connection with the second embodiment, in a time measurement device of configuration $J_3$ (see FIG. 6 or 13), which belongs to the configuration $J_2$, the clock selector can output, based on the timing relationship, selectively either the clock signal (623 or 723) having the same phase as the reference clock signal (clk or clk_str) or a clock signal (624 or 724) resulting from inverting the phase of the reference clock signal.

Still more specifically, in connection with the second embodiment, in a time measurement device of configuration $J_4$, which belongs to the configuration $J_3$, the measured time interval ($T_{INT}$) is the length of time between the timing ($t_A$) at which the signal level of the first target signal shifts from a first predetermined level to a second predetermined level and the timing ($t_B$) at which the signal level of the second target signal shifts from the first predetermined level to the second predetermined level. The clock selector can then output the clock signal having the same phase as the reference clock signal when the timing at which the signal level of the filtering target signal (start or stop trigger signal) shifts from the first predetermined level to the second predetermined level falls in the range from 90° to 270° in terms of the phase of the reference clock signal (cases A2 and A3, or cases B2 and B3), and can otherwise (cases A1 and A4, or cases B1 and B4) output the clock signal resulting from inverting the phase of the reference clock signal.

With configuration $J_4$, as discussed above in connection with configuration $J_7$, it is possible to reliably avoid generation of one clock worth of jitter, and also to detect the phase (φstr or φstp) in segments where good linearity is obtained, ensuring high-accuracy time interval measurement.

<<Modifications>>

The embodiments of the present invention allow for many modifications made as necessary within the scope of the technical concept set forth in the appended claims. The embodiments described above are merely examples of how the present invention can be implemented, and the senses of the terms used to define the present invention and its features are not limited to those in which they are used in the description of the embodiments given above. All specific values mentioned in the above description are merely examples, and can naturally be altered to different values.

Time measurement devices according to the present invention find applications in the operation interval measurement and control of a beam chopper that operates pulsewise in an X-ray free electron laser accelerator and in the time interval measurement and control of pump light and probe light in a pump-and-probe process. Time measurement devices according to the present invention find applications also in time interval measurement between two arbitrary pulse signals. Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims

LIST OF REFERENCE SIGNS

10, 100 start-side phase detection unit
11, 101 band-pass filter
13, 103 phase detector 20, 200 stop-side phase detector unit
21, 201 band-pass filter
23, 203 phase detector
30, 300 counter unit (number-of-periods detector)
40, 400 processor
600 start-side trigger detector
700 stop-side trigger detector

The invention claimed is:

1. A time measurement device for measuring a time interval between input timings of first and second target signals each being a pulsed signal, the time measurement device comprising:
   a number-of-periods detector that detects, by using a clock signal with a predetermined clock frequency and a predetermined clock period, the time interval in units of the clock period;
   a phase detection unit including a band-pass filter, wherein
      the band-pass filter receives at least one of the first and second target signals as a filtering target signal and extracts a signal component of the clock frequency from the filtering target signal, and
      the phase detection unit detects a phase difference between the extracted signal and the clock signal; and
   a processor that derives, by using a result detected by the number-of-periods detector and the phase difference detected by the phase detection unit, the time interval at a resolution finer than the clock period.

2. The time measurement device of claim 1, further comprising:
   a clock selector that selectively outputs, based on a timing relationship between the filtering target signal and a reference clock signal having the clock frequency, either a clock signal having a same phase as the reference clock signal or a clock signal having a different phase from the reference clock signal, wherein
   the phase detection unit detects a phase difference between the extracted signal of the band-pass filter and an output clock signal of the clock selector.

3. The time measurement device of claim 2, wherein
   the clock selector selectively outputs, based on the timing relationship, either the clock signal having the same phase as the reference clock signal or a clock signal resulting from inverting a phase of the reference clock signal.

4. The time measurement device of claim 3, wherein
   the measured time interval is a length of time between a timing at which a signal level of the first target signal shifts from a first predetermined level to a second predetermined level and a timing at which a signal level of the second target signal shifts from the first predetermined level to the second predetermined level, and
   the clock selector outputs the clock signal having the same phase as the reference clock signal when a timing at which a signal level of the filtering target signal shifts from the first predetermined level to the second predetermined level falls in a range from 90° to 270° in terms of the phase of the reference clock signal, the clock selector otherwise outputting the clock signal resulting from inverting the phase of the reference clock signal.

5. The time measurement device of claim 1, further comprising:
   a first clock selector that selectively outputs, based on a timing relationship between the first target signal and an original clock signal having the clock frequency, either a clock signal having a same phase as the original clock signal or a clock signal having a different phase from the original clock signal; and
   a second clock selector that selectively outputs, based on a timing relationship between the second target signal and an output clock signal of the first clock selector, either a clock signal having a same phase as the output clock signal of the first clock selector or a clock signal having a different phase from the output clock signal of the first clock selector,
   the phase detection unit includes:
      a first phase detection unit including a first band-pass filter, wherein
         the first band-pass filter extracts a signal component of the clock frequency from the first target signal, and
         the first phase detection unit detects a phase difference between the extracted signal of the first band-pass filter and the output clock signal of the first clock selector; and
      a second phase detection unit including a second band-pass filter, wherein
         the second band-pass filter extracts a signal component of the clock frequency from the second target signal, and
         the second phase detection unit detects a phase difference between the extracted signal of the second band-pass filter and the output clock signal of the second clock selector, and
   the processor derives the time interval at the resolution finer than the clock period by using the result detected by the number-of-periods detector and the phase differences detected by the first and second phase detection units.

6. The time measurement device of claim 5, wherein
   the first clock selector selectively outputs, based on a timing relationship between the first target signal and the original clock signal, either the clock signal having the same phase as the original clock signal or a clock signal resulting from inverting a phase of the original clock signal, and
   the second clock selector selectively outputs, based on a timing relationship between the second target signal and the output clock signal of the first clock selector, either the clock signal having the same phase as the output clock signal of the first clock selector or a clock signal resulting from inverting a phase of the output clock signal of the first clock selector.

7. The time measurement device of claim 6, wherein
   the measured time interval is a length of time between a timing at which a signal level of the first target signal shifts from a first predetermined level to a second predetermined level and a timing at which a signal level of the second target signal shifts from the first predetermined level to the second predetermined level,
   the first clock selector outputs the clock signal having the same phase as the original clock signal when a timing at which the signal level of the first target signal shifts from the first predetermined level to the second predetermined level falls in a range from 90° to 270° in terms of the phase of the original clock signal, the first clock selector otherwise outputting the clock signal resulting from inverting the phase of the original clock signal, and
   the second clock selector outputs the clock signal having the same phase as the output clock signal of the first clock selector when a timing at which a signal level of the second target signal shifts from the first predetermined level to the second predetermined level falls in a range from 90° to 270° in terms of the phase of the output clock signal of the first clock selector, the second clock selector otherwise outputting the clock signal resulting from inverting the phase of the output clock signal of the first clock selector.

8. The time measurement device claim 5, wherein the number-of-periods detector detects the time interval in units of the clock frequency by using a signal based on the first target signal and the original clock signal and a signal based on the second target signal and the output clock signal of the first clock selector.

9. The time measurement device of claim 1, wherein the phase detection unit includes:
   a first phase detection unit including a first band-pass filter, wherein
      the first band-pass filter extracts as a first extracted signal a signal component of the clock frequency from the first target signal, and
      the first phase detection unit detects a phase difference between the first extracted signal and the clock signal; and
   a second phase detection unit including a second band-pass filter, wherein
      the second band-pass filter extracts as a second extracted signal a signal component of the clock frequency from the second target signal, and
      the second phase detection unit detects a phase difference between the second extracted signal and the clock signal, and
the processor derives the time interval at the resolution finer than the clock period by using the result detected by the number-of-periods detector and the phase differences detected by the first and second phase detection units.

* * * * *